US011908849B2

(12) United States Patent
Lee et al.

(10) Patent No.: US 11,908,849 B2
(45) Date of Patent: Feb. 20, 2024

(54) DISPLAY DEVICE

(71) Applicant: Samsung Display Co., LTD., Yongin-si (KR)

(72) Inventors: Hang Jae Lee, Yongin-si (KR); Sung Jae Yun, Hwaseong-si (KR); Yuk Hyun Nam, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 169 days.

(21) Appl. No.: 17/477,014

(22) Filed: Sep. 16, 2021

(65) Prior Publication Data

US 2022/0189939 A1 Jun. 16, 2022

(30) Foreign Application Priority Data

Dec. 16, 2020 (KR) .................. 10-2020-0176294

(51) Int. Cl.
*H01L 27/12* (2006.01)
*H01L 25/16* (2023.01)

(52) U.S. Cl.
CPC .......... *H01L 25/167* (2013.01); *H01L 27/124* (2013.01)

(58) Field of Classification Search
CPC .................. H01L 25/167; H01L 27/124
See application file for complete search history.

(56) References Cited

U.S. PATENT DOCUMENTS

| 2011/0089850 | A1* | 4/2011 | Shibata | H05B 45/00 257/E33.001 |
|---|---|---|---|---|
| 2016/0079333 | A1* | 3/2016 | Shishido | G09G 3/3607 257/72 |
| 2019/0109154 | A1* | 4/2019 | Lin | H01L 27/0292 |
| 2019/0204969 | A1* | 7/2019 | Jo | H10K 59/124 |
| 2021/0280753 | A1 | 9/2021 | Kim et al. | |
| 2021/0320231 | A1* | 10/2021 | Kim | H01L 25/167 |
| 2022/0077228 | A1 | 3/2022 | Do et al. | |
| 2022/0093828 | A1 | 3/2022 | Kwag et al. | |

FOREIGN PATENT DOCUMENTS

| EP | 3 832 739 | 6/2021 |
|---|---|---|
| EP | 3 890 021 | 10/2021 |
| EP | 3 913 678 | 11/2021 |
| KR | 10-2020-0088962 | 7/2020 |
| WO | 2020/027401 | 2/2020 |
| WO | 2020/111452 | 6/2020 |
| WO | 2020/149475 | 7/2020 |

OTHER PUBLICATIONS

Extended European Search Report for European Patent Application or Patent No. 21214186.5 dated May 16, 2022.

* cited by examiner

*Primary Examiner* — James A Dudek

(74) *Attorney, Agent, or Firm* — KILE PARK REED & HOUTTEMAN PLLC

(57) ABSTRACT

A display device includes electrodes disposed on a substrate, extended in a first direction, and spaced apart from one another in a second direction intersecting the first direction, and light-emitting elements having ends disposed on the electrodes, wherein the electrodes include a first electrode having a first portion and a second portion, and a floating electrode adjacent to the first portion of the first electrode, and a width of the second portion is greater than a width of the first portion in the second direction.

25 Claims, 21 Drawing Sheets

DISPLAY DEVICE

CROSS-REFERENCE TO RELATED APPLICATION(S)

This application claims priority to and benefits of Korean Patent Application No. 10-2020-0176294 under 35 U.S.C. § 119 filed on Dec. 16, 2020, in the Korean Intellectual Property Office, the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel or a liquid-crystal display panel for displaying images. Among them, the light-emitting display panel may include light-emitting elements. For example, light-emitting diodes (LEDs) may include an organic light-emitting diode (OLED) using an organic material such as a luminescent material, and an inorganic light-emitting diode using an inorganic material such as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that can prevent light-emitting elements from gathering and deviating.

It should be noted that objects of the disclosure are not limited to the above-mentioned objects; and other objects of the disclosure will be apparent to those skilled in the art from the following descriptions.

According to embodiments, at least some or a number of the electrodes have portions having a narrow width in a display device, thereby preventing the light-emitting diodes from gathering at a particular location of the emission area.

According to an embodiment, portions having a narrow width are formed at at least some or a number of the electrodes at the edges of the emission area, so that the distances between the electrodes are increased. By doing so, the intensity of the electric field is reduced to prevent the light-emitting diodes from gathering at the edges of the emission area and to guide them to the middle of the emission area.

According to an embodiment, portions having a narrow width are formed at at least some or a number of the electrodes, and floating electrodes are formed between the electrodes generating an electric field, so that the intensity of the electric field can be reduced.

According to an embodiment, a corner of the electrodes where the electric field is concentrated is inclined, chamfered or rounded, so that the intensity of the electric field can be reduced to prevent the light-emitting diodes from gathering at the corner and to guide them to the middle of the emission area.

It should be noted that effects are not limited to those described above and other effects will be apparent to those skilled in the art from the following descriptions.

According to an embodiment, the display device may include electrodes disposed on a substrate, extended in a first direction, and spaced apart from one another in a second direction intersecting the first direction; and light-emitting elements having ends disposed on the electrodes, wherein the electrodes may comprise a first electrode having a first portion and a second portion; and a floating electrode adjacent to the first portion of the first electrode, and a width of the second portion may be greater than a width of the first portion in the second direction.

In an embodiment, the electrodes may include a second electrode spaced apart from the first electrode in the second direction; a third electrode disposed between the first electrode and the second electrode; and a fourth electrode spaced apart from the second electrode in the second direction, and the floating electrode may be disposed between the first portion of the first electrode and the third electrode.

In an embodiment, the first electrode may include an inner side facing the third electrode, and a distance between the inner side of the first portion of the first electrode and the third electrode may be greater than a distance between the inner side of the second portion of the first electrode and the third electrode.

In an embodiment, the distance between the inner side of the first portion of the first electrode and the third electrode may be measured in the second direction, and the floating electrode may be disposed between the first electrode and the third electrode.

In an embodiment, an outer side of the first portion of the first electrode may be parallel to at least a side of the third electrode facing the first electrode in the first direction.

In an embodiment, the inner side of the first portion of the first electrode may be recessed in the second direction from the inner side of the second portion.

In an embodiment, the third electrode may include a first portion and a second portion, and the floating electrode may be disposed between the first portion of the first electrode and the first portion of the third electrode.

In an embodiment, each of the first electrode and the third may include first portions spaced apart from each other in the first direction, and the second portion may be disposed between the first portions.

In an embodiment, the first portion of the third electrode may include at least one chamfered or rounded corner in at least one bent edge of the first portion of the third electrode.

In an embodiment, the first portion of the first electrode may comprise at least one chamfered or rounded corner in at least one bent edge first portion of the first electrode.

In an embodiment, ends of the light-emitting elements may be disposed on the first electrode and the third electrode, and disposed on the second electrode and the fourth electrode.

In an embodiment, the display device may further include contact electrodes disposed on the electrodes and in contact with at least part of the light-emitting elements.

According to an embodiment of the disclosure, the display device may include a first electrode and a second electrode disposed on a substrate and extended in a first direction; a third electrode disposed between the first electrode and the second electrode; and a fourth electrode spaced apart from the second electrode in a second direction intersecting the first direction; and light-emitting elements having ends disposed on the first electrode and the third electrode, and on the second electrode and the fourth electrode, wherein the first electrode may include a first portion that is bent and adjacent to the third electrode; and a floating electrode adjacent to the first portion of the first electrode, and the floating electrode may be disposed between the first portion of the first electrode and the third electrode.

In an embodiment, the first electrode may include an extended electrode portion extended in the first direction; and a bent electrode portion bent from a side of the extended electrode portion in the first direction and extended in the second direction.

In an embodiment, the first portion of the first electrode may be disposed at an area where the extended electrode portion meets the bent electrode portion.

In an embodiment, the third electrode may include an inner side facing the first electrode, the inner side of the third electrode may be parallel to the first direction, and the floating electrode may be disposed between the first portion of the first electrode and the inner side of the third electrode.

In an embodiment, the third electrode may include a third portion and a fourth portion having a greater width than a width of the third portion in the second direction, and the floating electrode may be disposed between the first portion of the first electrode and the third portion of the third electrode.

In an embodiment, the third portion of the third electrode may include at least one chamfered or rounded corner in at least one bent edge of the third portion of the third electrode.

According to an embodiment of the disclosure, the display device may include first-type electrodes disposed on a substrate, extended in a first direction, and spaced apart from one another in a second direction intersecting the first direction; second-type electrodes spaced apart from the first-type electrodes in the second direction between the first-type electrodes; and light-emitting elements disposed on the first-type electrodes and the second-type electrodes, wherein each of the first-type electrodes may include a first portion and a second portion having a width greater than a width of the first portion in the second direction, and a floating electrode adjacent to the first portion, and a distance between the first portion of the first-type electrodes and the second-type electrodes facing the first portion may be greater than a distance between the second portion of the first-type electrodes and the second-type electrode facing the second portion.

In an embodiment, the floating electrode may be disposed between the first portion of the first-type electrodes and the second-type electrodes.

In an embodiment, the second-type electrodes may include a first portion and a second portion, the first portion of the first-type electrodes and the first portion of the second-type electrodes may face each other, and the second portion of the first-type electrodes and the second portion of the second-type electrode may face each other.

In an embodiment, the floating electrode may be disposed between the first portion of the first-type electrodes and the first portion of the second-type electrodes.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
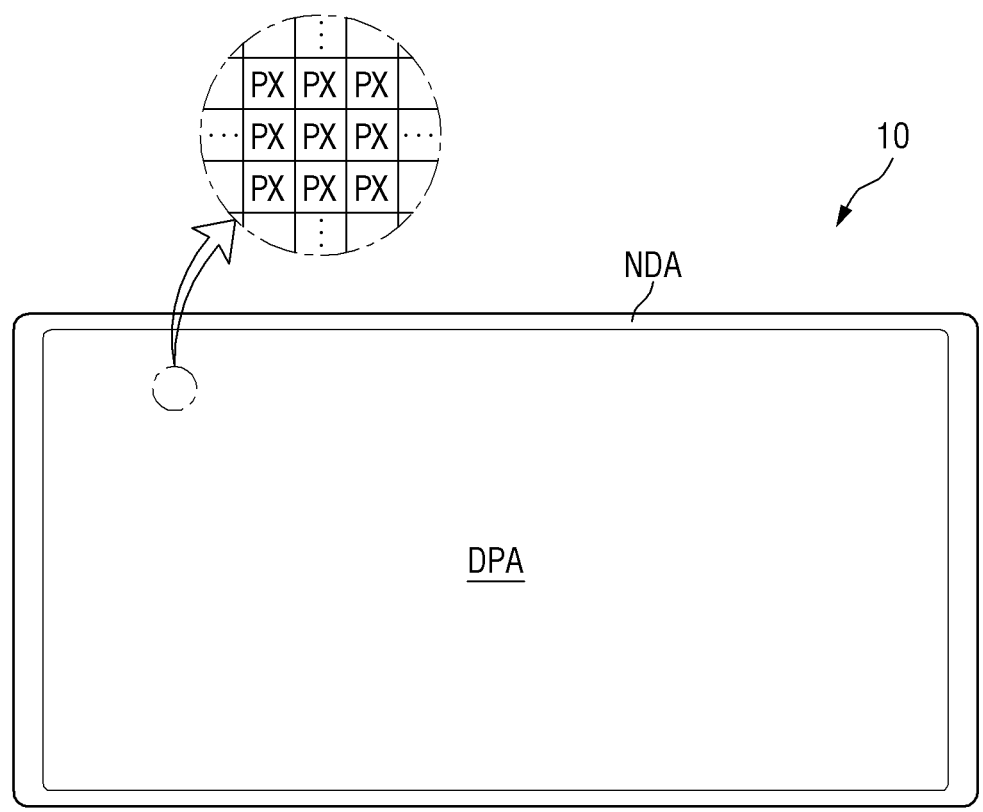
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the drawings, sizes, thicknesses, ratios, and dimensions of the elements may be exaggerated for ease of description and for clarity.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments may be combined or combined with each other, in part or in whole, and other variations are possible. Each embodiment may be implemented independently of each other or may be implemented together in an association.

Hereinafter, embodiments will be described with reference to the accompanying drawings.

FIG. 1 is a schematic plan view of a display device according to an embodiment.

Referring to FIG. 1, the display device 10 displays a moving image or a still image. The display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc. within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. within the spirit and the scope of the disclosure. In the following description, an inorganic light-emitting diode display panel is employed as an example of the display panel 10, but the disclosure is not limited thereto. Any other display panel may be employed as long as the technical idea can be equally applied.

The shape of the display device 10 may be modified in a variety of ways. For example, the display device 10 may have shapes such as substantially a rectangle with longer lateral sides, substantially a rectangle with longer vertical sides, substantially a square, substantially a quadrangle with substantially rounded corners (vertices), other polygons, a circle, etc. within the spirit and the scope of the disclosure. The shape of a display area DPA of the display device 10 may also be similar to the overall shape of the display device 10. In the example shown in FIG. 1, the display device 10 has a rectangular shape with the longer sides in a second direction DR2.

The display device 10 may include the display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged or disposed in a matrix. The shape of each pixel PX may be, but is not limited to, substantially a rectangle or substantially a square when viewed from the top. Each pixel may have a substantially diamond shape having sides inclined with respect to a direction. The pixels PX may be arranged or disposed in stripes or the PenTile® pattern alternately. Each of the pixels PX may include at least one light-emitting element that emits light of a wavelength band to represent a color.

The non-display area NDA may be disposed around the display area DPA. The non-display area NDA may surround or may be adjacent to the display area DPA entirely or partially. The display area DPA may have a substantially rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
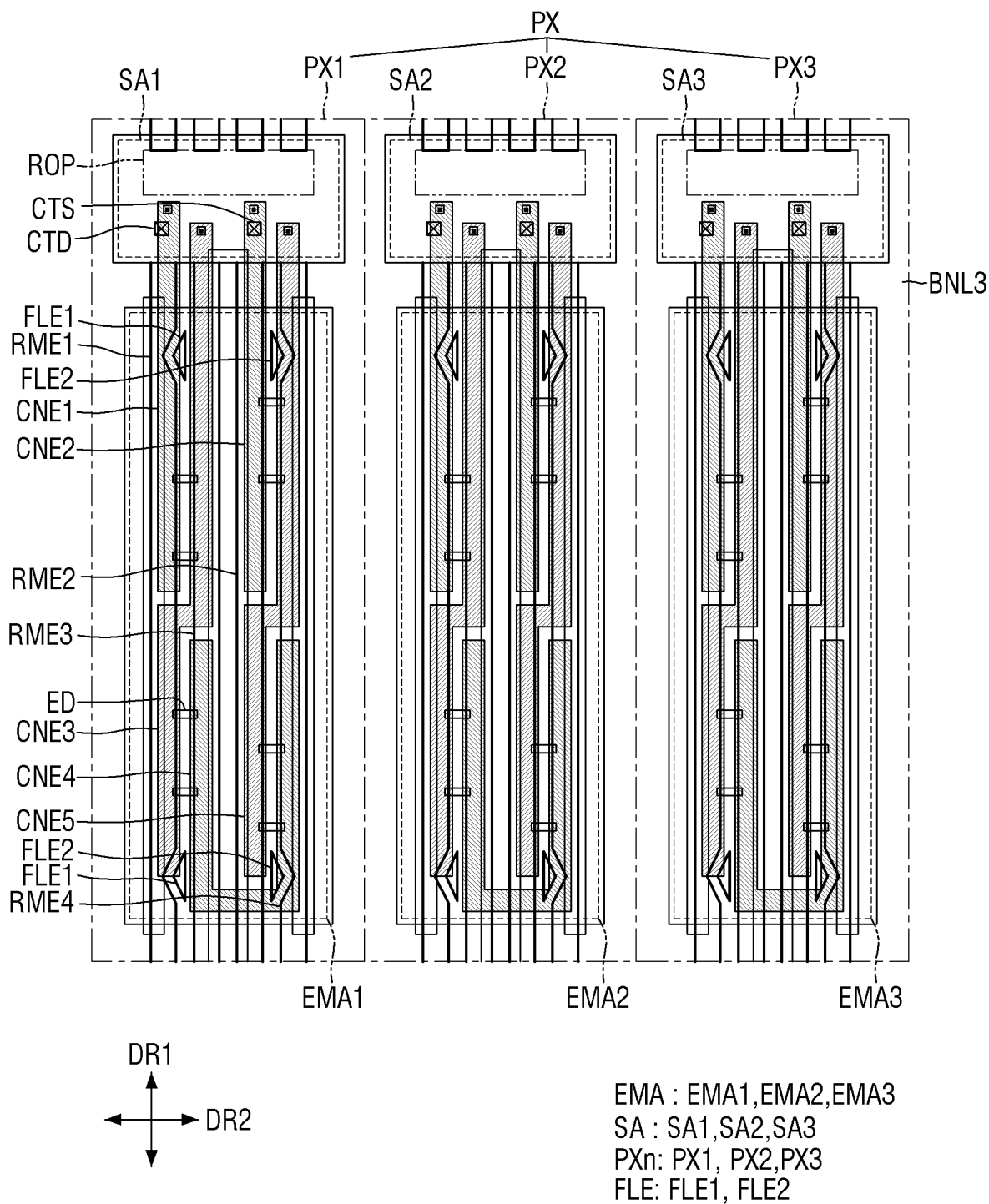
FIG. 2 is a schematic plan view showing a pixel of a display device according to an embodiment.

FIG. 2 is a schematic plan view showing a pixel of a display device according to an embodiment.

Referring to FIG. 2, each of the pixels PX of the display device 10 may include sub-pixels PXn, where n is an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be red, the second color may be green, and the third color may be blue. It is, however, to be understood that the disclosure is not limited thereto. All the sub-pixels PXn may emit light of the same color. Although the single pixel PX may include three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area (not shown). In the emission area EMA, the light-emitting elements ED may be disposed to emit light of a wavelength. In the non-emission area, no light-emitting element ED is disposed and light emitted from the light-emitting elements ED do not reach and thud no light exits therefrom. The emission area may include an area in which the light-emitting elements ED are disposed, and may include an area adjacent to the light-emitting elements ED where lights emitted from the light-emitting element ED exit.

It is, however, to be understood that the disclosure is not limited thereto. The emission area may also include an area in which light emitted from the light-emitting element ED is reflected or refracted by other elements to exit. The light-emitting diodes ED may be disposed in each of the sub-pixels PXn, and the emission area may include the area where the light-emitting elements are disposed and the adjacent area.

Although a first emission area EMA1 of the first sub-pixel PX1, a second emission area EMA2 of the second sub-pixel PX2 and a third emission area EMA3 of the third sub-pixel PX3 have substantially uniform area in the drawings, the disclosure is not limited thereto. In an embodiment, the emission areas EMA of the sub-pixels PXn may have different areas depending on a color or wavelength band of light emitted from the light-emitting diodes ED disposed in the respective sub-pixels.

Each of the sub-pixels PXn may further include a subsidiary area SA disposed in the non-emission area. The subsidiary area SA may be disposed on a side of the emission area EMA in the first direction DR1, and may be disposed between the emission areas EMA of the sub-pixels PXn adjacent to each other in the first direction DR1. For example, the emission areas EMA and the subsidiary areas SA may be arranged or disposed repeatedly in the second direction DR2, and may be arranged or disposed alternately in the first direction DR1. A third bank BNL3 may be disposed between the subsidiary areas SA and the emission areas EMA, and the distance between them may vary depending on the width of the third bank BNL3. No light-emitting diode ED is disposed in the subsidiary areas SA and thus no light exits therefrom. The electrodes RME disposed in the sub-pixels PXn may be partially disposed in the subsidiary areas SA. The electrodes RME disposed in some or a number of sub-pixels PXn may be disposed separately from one another in the subsidiary area SA. A third direction DR3 may be a thickness direction.

Although a first subsidiary area SA1 of the first sub-pixel PX1, a second subsidiary area SA2 of the second sub-pixel PX2, and the third subsidiary area SA3 of the third sub-pixel PX3 are spaced apart from the respective emission areas EMA and disposed on the upper side in the first direction DR1 in the drawings, the disclosure is not limited thereto. In an embodiment, the subsidiary areas SA of some or a number of the sub-pixels PXn may be spaced apart from the respective emission areas EMA and disposed on the upper side in the first direction DR1 upward, while the subsidiary areas SA of some or a number of others of the sub-pixels PXn may be spaced apart from the respective emission areas EMA and disposed on the lower side in the first direction DR1.

The third bank BNL3 may be disposed in a lattice pattern on the front surface of the display area DPA including portions extended in the first direction DR1 and the second direction DR2 when viewed from the top. The third bank BNL3 may be disposed along the border of each of the sub-pixels PXn to distinguish adjacent sub-pixels PXn from one another. The third bank BNL3 may be disposed to surround the emission area EMA and the subsidiary area SA disposed in each of the sub-pixels PXn to distinguish them.

Figure 3:
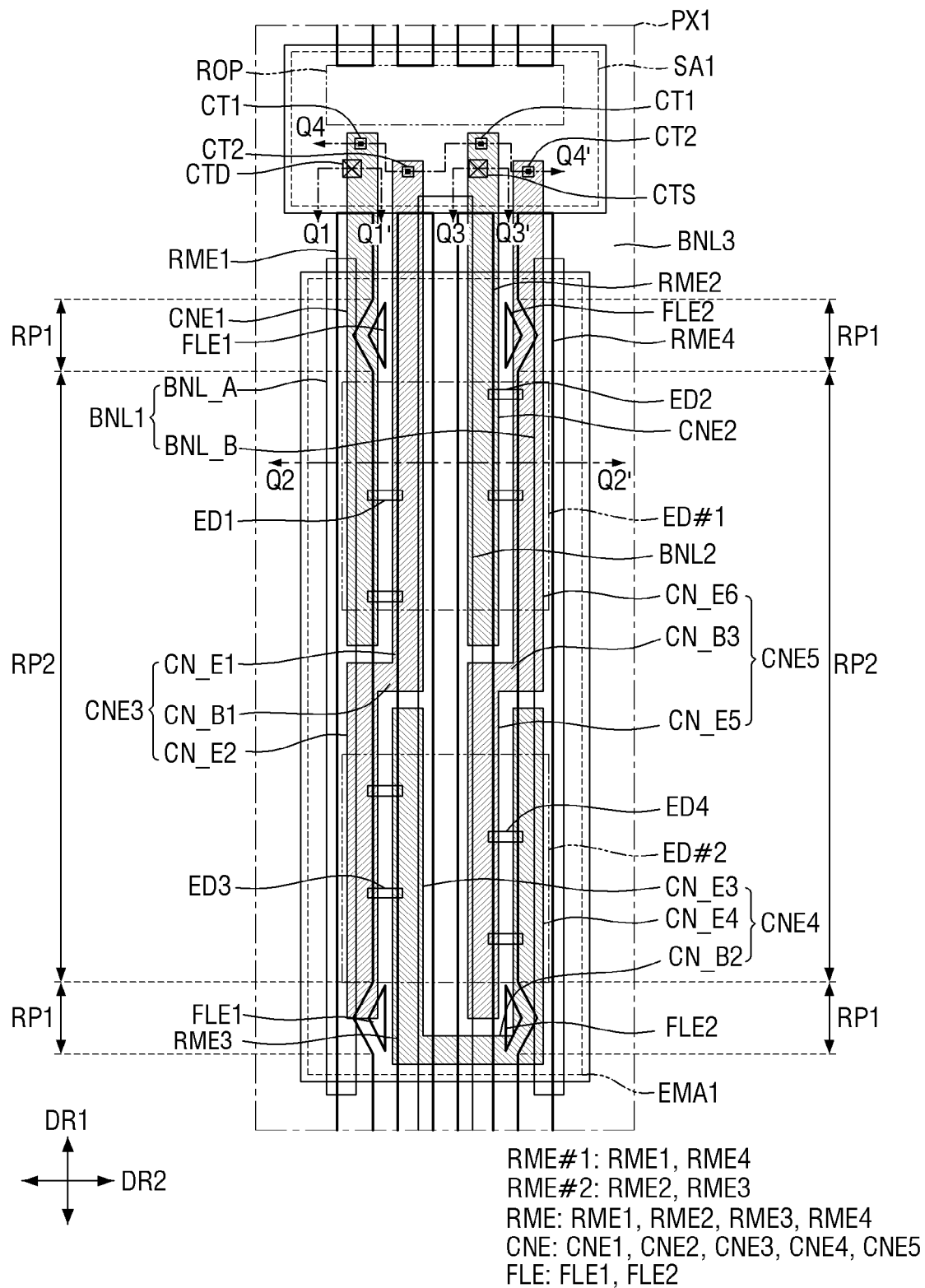
FIG. 3 is a schematic plan view showing the first sub-pixel of FIG. 2.
Figure 4:
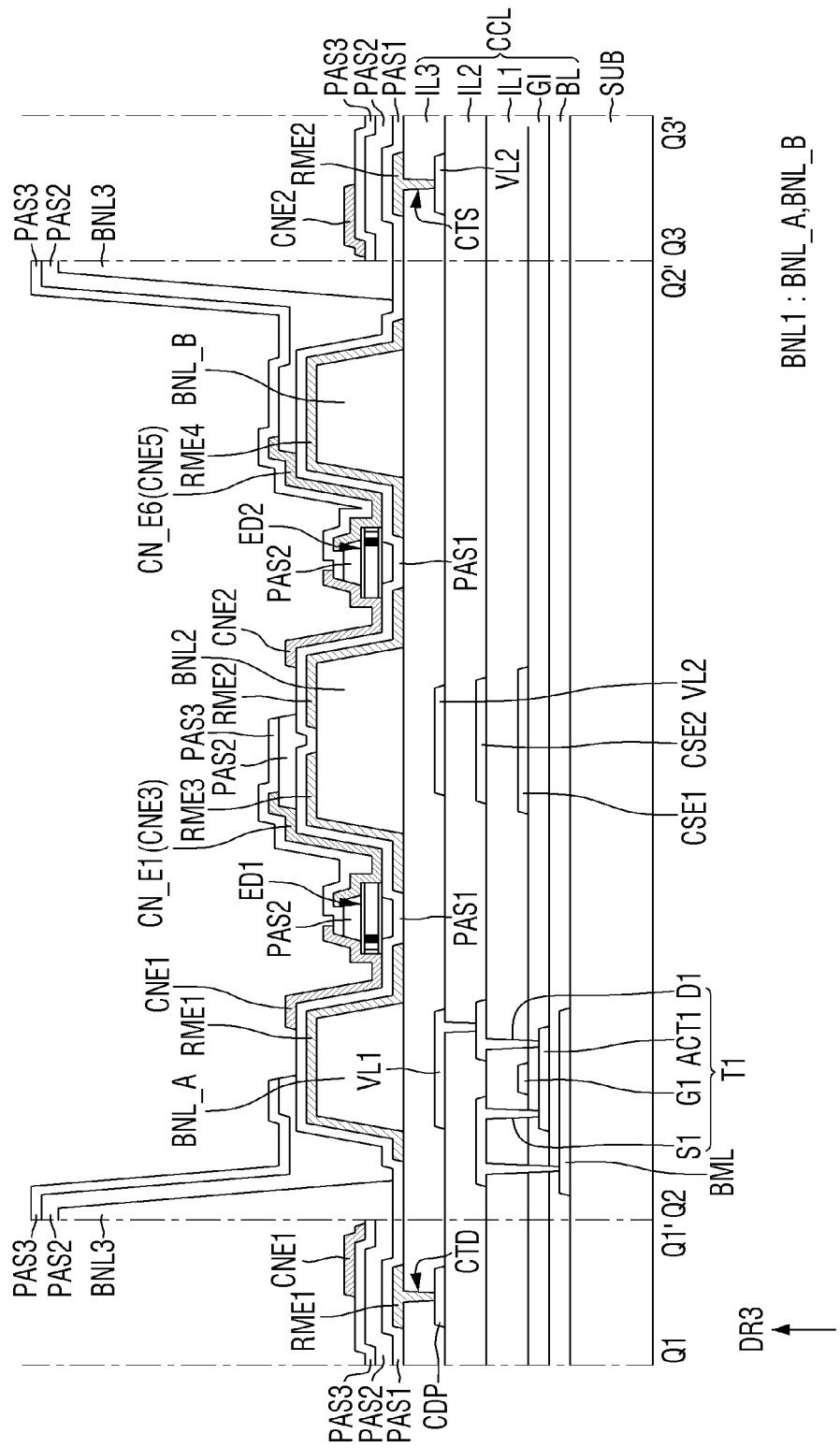
FIG. 4 is a schematic cross-sectional view taken along lines Q1-Q1', Q2-Q2' and Q3-Q3' of FIG. 3.
Figure 5:
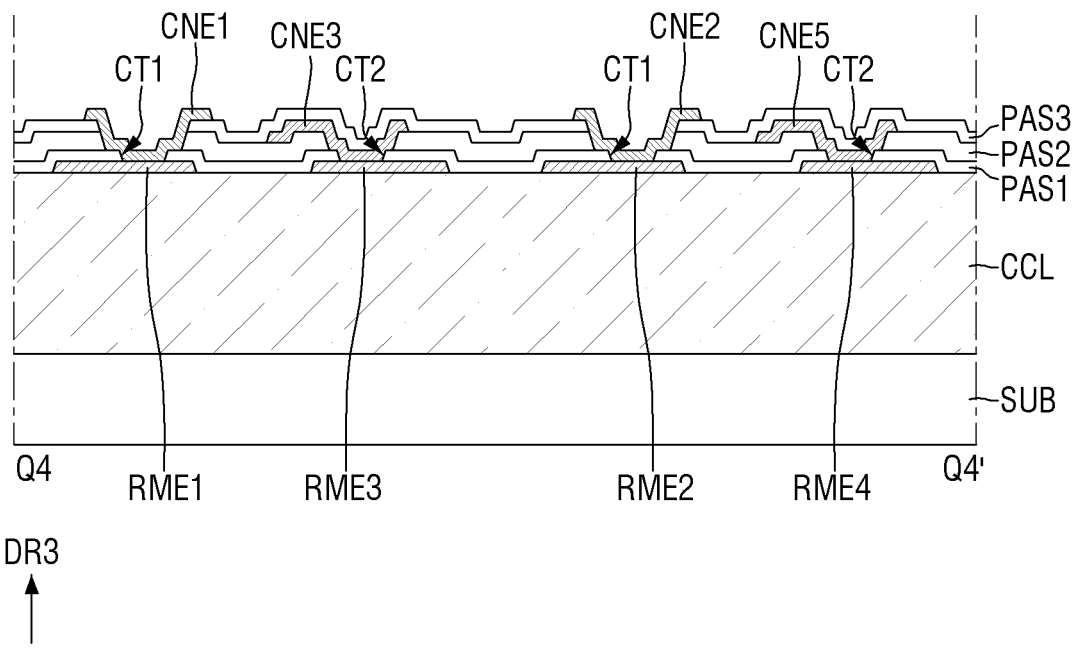
FIG. 5 is a schematic cross-sectional view taken along line Q4-Q4' of FIG. 3.

FIG. 3 is a schematic plan view showing the first sub-pixel of FIG. 2. FIG. 4 is a schematic cross-sectional view taken along lines Q1-QP, Q2-QT and Q3-Q3' of FIG. 3. FIG. 5 is a schematic cross-sectional view taken along line Q4-Q4' of FIG. 3. FIG. 3 shows a first sub-pixel PX1 included in one pixel PX, and FIG. 4 shows a cross section passing through both ends of light-emitting diodes ED disposed in one sub-pixel PXn. FIG. 5 shows a cross-section of contacts CT1 and CT2 where electrodes RME are electrically connected with contact electrodes CNE.

Referring to FIGS. 3 to 5 in conjunction with FIG. 2, the display device 10 may include a first substrate SUB, a semiconductor layer disposed on the first substrate SUB, conductive layers, and insulating layers. The semiconductor layer, the conductive layers and the insulating layers may form a circuit layer CCL and a display element layer of the display device 10.

The first substrate SUB may be an insulating substrate. The first substrate SUB may be made of an insulating material such as glass, quartz and a polymer resin. The first substrate SUB may be either a rigid substrate or a flexible substrate that can be bent, folded, or rolled.

A first conductive layer may be disposed on the first substrate SUB. The first conductive layer may include a bottom metal layer BML. The bottom metal layer BML is disposed to overlap an active layer ACT1 of a first transistor T1. The bottom metal layer BML may include a material that blocks light, and thus can prevent light from entering the active layer ACT1 of the first transistor T1. It is, however, to be noted that the bottom metal layer BML may be eliminated in some implementations.

A buffer layer BL may be disposed entirely on the bottom metal layer BML and the first substrate SUB. The buffer layer BL may be formed on the first substrate SUB to protect the transistors of the pixel PX from moisture permeating through the first substrate SUB that is susceptible to moisture permeation, and may also provide a flat surface.

The semiconductor layer is disposed on the buffer layer BL. The semiconductor layer may include the active layer ACT1 of the first transistor T1. These may be disposed to partially overlap with a gate electrode G1 of a second conductive layer, etc., which will be described later.

The semiconductor layer may include polycrystalline silicon, monocrystalline silicon, an oxide semiconductor, etc. within the spirit and the scope of the disclosure. In case that the semiconductor layer may include an oxide semiconductor, the active layer ACT1 may include conductive regions and a channel region therebetween. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc. within the spirit and the scope of the disclosure.

In other embodiments, the semiconductor layer may include polycrystalline silicon. The polycrystalline silicon may be formed by crystallizing amorphous silicon, and, the conductive regions of the active layer ACT1 may be doped regions doped with impurities.

Although only the first transistor T1 among the transistors included in the sub-pixels PXn of the display device 10 is depicted in the drawing, the disclosure is not limited thereto. The display device 10 may include a larger number of transistors. For example, the display device 10 may include more than one transistors in addition to the first transistor T1, for example, two or three transistors in each of the sub-pixels PXn.

A first gate insulating layer GI is disposed on the semiconductor layer and the buffer layer BL. The first gate insulating layer GI may work as a gate insulator of each of the transistors.

The second conductive layer is disposed on the first gate insulating layer GI. The second conductive layer may include the gate electrode G1 of the first transistor T1 and a first capacitor electrode CSE1 of a storage capacitor. The gate electrode G1 may be disposed so that it overlaps the channel region of the active layer ACT1 in the thickness direction. The first capacitor electrode CSE1 may be disposed so that it overlaps a second capacitor electrode CSE2 described later in the thickness direction. According to embodiments, the first capacitor electrode CSE1 may be integrated and electrically connected with the gate electrode G1.

A first interlayer dielectric layer IL1 is disposed on the second conductive layer. The first interlayer dielectric layer IL1 may serve as an insulating layer between the second conductive layer and other layers disposed thereon. The first interlayer dielectric layer IL1 may be disposed so that it covers or overlaps the second conductive layer to protect it.

The third conductive layer is disposed on the first interlayer dielectric layer ILL The third conductive layer may include a first source electrode S1 and a first drain electrode D1 of the first transistor T1 and the second capacitor electrode CSE2.

The first source electrode S1 and the first drain electrode D1 of the first transistor T1 may be in contact with the doping regions of the active layer ACT1, respectively, through the contact holes penetrating through the first interlayer dielectric layer IL1 and the first gate insulator GI. The first source electrode S1 of the first transistor T1 may be in contact with the bottom metal layer BML through another contact hole.

The second capacitor electrode CSE2 may be disposed to overlap the first capacitor electrode CSE1 in the thickness direction. According to an embodiment, the second capacitor electrode CSE2 may be integrally connected to the first source electrode S1. The storage capacitor may be formed between the first capacitor electrode CSE1 and the second capacitor electrode CSE2.

Although not shown in the drawings, the third conductive layer may further include a data line that applies a data signal to another transistor. The data line may be electrically connected to the source or drain electrodes of another transistor to transfer a signal applied from the data line.

A second interlayer dielectric layer IL2 is disposed on the third conductive layer. The second interlayer dielectric layer IL2 may serve as an insulating layer between the third conductive layer and other layers disposed thereon. The second interlayer dielectric layer IL2 may cover or overlap the third conductive layer to protect it.

The fourth conductive layer is disposed on the second interlayer dielectric layer IL2. The fourth conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode RME2.

The first conductive pattern CDP may be electrically connected to the second capacitor electrode CSE2 and may be electrically connected to the first transistor T1 through it. The first conductive pattern CDP may also be in contact with the first electrode RME1 to be described later. The first transistor T1 may transfer the first supply voltage applied from the first voltage line VL1 to the first electrode RME1. Although the fourth conductive layer may include one second voltage line VL2 and one first voltage line VL1 in the example shown in the drawings, the disclosure is not limited thereto. The fourth conductive layer may include more than one first voltage lines VL1 and second voltage lines VL2.

The buffer layer BL, the first gate insulating layer GI, the first interlayer dielectric layer IL1 and the second interlayer dielectric layer IL2 may be made up of multiple inorganic layers stacked each other alternately. For example, the buffer layer BL, the first gate insulating layer GI, the first interlayer dielectric layer IL1 and the second interlayer dielectric layer IL2 may be made up of a double layer in which inorganic layers including at least one of silicon oxide (SiOx), silicon nitride (SiNx) and silicon oxynitride (SiON) are stacked each other or multiple layers in which they may be alternately stacked each other. It is, however, to be understood that the disclosure is not limited thereto. The buffer layer BL, the first gate insulating layer GI, the first interlayer dielectric layer IL1 and the second interlayer dielectric layer IL2 may be made up of a single inorganic layer including the above-described insulating material or may be made of an organic insulating material such as polyimide (PI).

The second conductive layer, the third conductive layer and the fourth conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The third interlayer dielectric layer IL3 is disposed on the fourth conductive layer. The third interlayer dielectric layer IL3 may include an organic insulating material, for example, an organic material such as polyimide (PI), to provide a flat surface.

On the third interlayer dielectric layer IL3, first bank BNL1, a second bank BNL2, electrodes RME, a light-emitting diode ED, contact electrodes CNE and a third bank BNL3 are disposed, as the display element layer. Insulating layers PAS1, PAS2 and PAS3 may be disposed on the third interlayer dielectric layer IL3.

The first banks BNL1 may be disposed in the emission areas EMA of the sub-pixels PXn and may be spaced apart from one another. For example, the first bank BNL1 may include sub-banks BNL_A and BNL_B spaced apart from each other in the second direction DR2 in each emission area EMA. The first sub-bank BNL_A may be disposed on the left side of the center of the emission area EMA, and the second sub-bank BNL_B may be disposed on the right side thereof. The sub-banks BNL_A and BNL_B may have a shape extended in the first direction DR1, with the length larger than the length of the open area surrounded by the third bank BNL3 in the first direction DR1. The first banks BNL1 may overlap a portion of the third bank BNL3 that is extended in the second direction DR2. One first sub-bank BNL_A and one second sub-bank BNL_B are disposed in one sub-pixel PXn, to form an island-like pattern extended in one direction with a relatively narrow width on the front surface of the display area DPA.

Like the first bank BNL1, the second bank BNL2 may be disposed on or directly on the third interlayer dielectric layer IL3. The second bank BNL2 may be extended in the first direction DR1 between the first sub bank BNL_A and the second sub bank BNL_B.

According to an embodiment, the second bank BNL2 may have a width measured in the second direction DR2 larger than that of the first banks BNL1, and a length in the first direction DR1 larger than that of the first banks BNL1. The length of the second bank BNL2 extending in the first direction DR1 may be longer than the length of the emission area EMA surrounded by the third bank BNL3, and a portion of the second bank BNL2 may be disposed in the subsidiary area SA of the sub-pixels PXn. One second bank BNL2 may be disposed across the sub-areas SA of different sub-pixels PXn adjacent to each other in the first direction DR1 and the emission area EMA of one of the sub-pixels PXn. The second bank BNL2 may be disposed in the sub-pixels PXn adjacent to each other in the first direction DR1 to form an island-like pattern on the front surface of the display area DPA.

The first banks BNL1 and the second banks BNL2 may have a structure that at least partly protrudes from the upper surface of the third interlayer dielectric layer IL3. The protruding portions of the first banks BNL1 and the second banks BNL2 may have inclined side surfaces. The light emitted from the light-emitting diodes ED may be reflected by the electrodes RME disposed on the first banks BNL1 and the second banks BNL2 so that the light may exit toward the upper side of the third interlayer dielectric layer IL3. The side surfaces of the first bank BNL1 and the second bank BNL2 may be inclined in a linear shape, but the disclosure is not limited thereto. The first bank BNL1 and the second bank BNL2 may have a substantially semicircle or substantially semi-ellipse shape with a substantially curved outer surface. The first bank BNL1 and the second bank BNL2 may include, but is not limited to, an organic insulating material such as polyimide (PI). The first bank BNL1 and the second bank BNL2 may be eliminated.

The electrodes RME has a shape extended in a direction and is disposed in each of the sub-pixels PXn. For example, the electrodes RME may have a shape extended in the first direction DR1 and may be spaced apart from each other in the second direction DR2 in each of the sub-pixels PXn. The electrodes RME of the display device 10 may include electrodes electrically connected or directly connected to the fourth conductive layer thereunder through electrode contact holes CTD and CTS penetrating the third interlayer dielectric layer IL3. In an embodiment, the display device 10 may further include electrodes that are not electrically connected or directly connected to the fourth conductive layer.

For example, the electrodes RME disposed in a single sub-pixel PXn may include a first electrode RME1 and a second electrode RME2 electrically connected or directly connected to the fourth conductive layer. The electrodes RME may further include a third electrode RME3 and a fourth electrode RME4 that are electrically connected or not directly connected to the fourth conductive layer but are electrically connected to the fourth conductive layer through electrodes electrically connected or directly connected to the fourth conductive layer and contact electrodes CNE.

The first electrode RME1 may be disposed on the left side with respect to the center of the emission area EMA. A portion of the first electrode RME1 is disposed on the first sub-bank BNL_A. The second electrode RME2 may be spaced apart from the first electrode RME1 in the second direction DR2 and may be disposed on the right side of the center of the emission area EMA. A portion of the second electrode RME2 may be disposed on one side or a side of the second bank BNL2 that faces the second sub-bank BNL_B.

The third electrode RME3 may be disposed between the first electrode RME1 and the second electrode RME2. The third electrode RME3 may be spaced apart from and face the first electrode RME1 and may be disposed on the second bank BNL2 and spaced apart from the second electrode RME2. A portion of the third electrode RME3 may be disposed on the side of the second bank BNL2 that faces the first sub-bank BNL_A. The fourth electrode RME4 may be spaced apart from the second electrode RME2 in the second direction DR2 and may be disposed on the right side of the center of the emission area EMA. A portion of the fourth electrode RME4 may be disposed on the second sub-bank BNL_B.

According to an embodiment, each of the first electrode RME1 and the second electrode RME2 may be an electrode electrically connected to the fourth conductive layer thereunder. For example, the first electrode RME1 may be electrically connected or directly connected to the first conductive pattern CDP of the fourth conductive layer through the first electrode contact hole CTD formed in the subsidiary area SA and penetrating the third interlayer dielectric layer IL3 thereunder. The second electrode RME2 may be electrically connected or directly connected to the second voltage line VL2 of the fourth conductive layer through the second electrode contact hole CTS formed in the subsidiary area SA and penetrating the third interlayer dielectric layer IL3 thereunder.

The first electrode RME1 may be electrically connected to the first transistor T1 through the first conductive pattern CDP to receive the first supply voltage. The second electrode RME2 may be electrically connected to the second voltage line VL2 to receive the second supply voltage. The supply voltages may be transmitted to the third electrode RME3 and the fourth electrode RME4 through contact electrodes CNE, which will be described later. Since the electrodes RME are disposed separately in each of the sub-pixels PXn, the light-emitting diodes ED of different sub-pixels PXn may emit light individually. Although the first electrode contact hole CTD and the second electrode contact hole CTS are formed in the subsidiary area SA in the drawings, the disclosure is not limited thereto. For example, the electrode contact holes CTD and CTS may be located in the emission area EMA surrounded by the third bank BNL3 or may be formed such that they overlap the third bank BNL3.

Although the third electrode RME3 and the fourth electrode RME4 are not electrically connected or directly connected to the fourth conductive layer thereunder, an electric signal applied or directly applied to first-type electrodes may be transmitted through the light-emitting diodes ED or the contact electrodes CNE. For example, even though the third electrode RME3 and the fourth electrode RME4 are not electrically connected or directly connected to the fourth conductive layer thereunder, the electrical signals applied therefrom may be transmitted and thus they are not floating.

The electrodes RME may be partially disposed in the subsidiary area SA of the sub-pixel PXn beyond the third bank BNL3. The electrodes RME extended in the first direction DR1 may be disposed across the subsidiary area SA of the sub-pixel PXn and the subsidiary area SA of another sub-pixel PXn adjacent to it in the first direction DR1. The electrodes RME of different sub-pixels PXn may be disposed separately in the subsidiary area SA. The electrodes RME of a sub-pixel PXn may be spaced apart from those of another sub-pixel PXn at a separation region ROP located or disposed in the subsidiary area SA of one of the sub-pixels PXn.

The electrodes RME separated from each other in the subsidiary area SA may be formed by forming a single electrode line extended in the second direction DR2 and separating it during a subsequent process after the light-emitting diodes ED have been disposed. The electrode line may be used to generate an electric field in the sub-pixel PXn to align the light-emitting diodes ED during the process of fabricating the display device 10. The light-emitting diodes ED may receive a dielectrophoretic force by the electric field generated over the electrode lines and may be aligned on the electrodes RME.

According to an embodiment, the width of the electrodes RME measured in the second direction DR2 may be smaller than the width of the first banks BNL1 and the second bank BNL2 measured in the second direction DR2. Each of the electrodes RME may be disposed to cover or overlap at least one side or a side of the first banks BNL1 or the second bank BNL2 to reflect light emitted from the light-emitting diodes ED. The spacing between the electrodes RME spaced apart from each other in the second direction DR2 may be smaller than the spacing between the first banks BNL1 and the second bank BNL2. At least a portion of each of the electrodes RME may be disposed on or directly on the third interlayer dielectric layer IL3 so that they may be disposed on the same plane.

The electrodes RME may be electrically connected to the light-emitting diodes ED. The electrodes RME may be electrically connected to both ends of the light-emitting diodes ED through the contact electrodes CNE to be described below, and may transmit electric signals applied from the fourth conductive layer to the light-emitting diodes ED. Electrical signals for allowing light-emitting diodes ED to emit light may be applied or directly applied to the first electrode RME1 and the second electrode RME2, and the electric signals may be transmitted to other electrodes through the contact electrodes CNE and light-emitting diodes ED, which will be described later.

Each of the electrodes REM may include a conductive material having a high reflectance. For example, the electrodes RME may include a metal such as silver (Ag), copper (Cu) and aluminum (Al) as the material having a high reflectance, and may be an alloy including aluminum (Al), nickel (Ni), lanthanum (La), etc. within the spirit and the scope of the disclosure. The electrodes RME may reflect light that is emitted from the light-emitting diodes ED and travels toward the side surfaces of the first banks BNL1 or the second banks BNL2 toward the upper side of each of the sub-pixels PXn.

It is, however, to be understood that the disclosure is not limited thereto. The electrodes RME may further include a transparent conductive material. For example, each of the electrodes RME may include a material such as ITO, IZO and ITZO. In an embodiment, each of the electrodes RME1 and RME2 may have a structure in which one or more layers of a transparent conductive material and one or more metal layers having high reflectivity may be stacked each other, or may be made up of a single layer including them. For example, each of the electrodes RME may have a stack structure such as ITO/Ag/ITO/, ITO/Ag/IZO, or ITO/Ag/ITZO/IZO.

It is to be noted that at least some or a number of the electrodes RME may include portions having different widths. According to an embodiment, the electrodes RME may include first-type electrodes RME #1 including portions having different widths measured in the second direction DR2 at different positions. The electrodes RME may further include second-type electrodes RME #2 that are spaced apart from the first-type electrodes RME #1 and face them and having a constant width measured in the second direction DR2 along the direction in which they are extended. The first-type electrodes RME #1 and the second-type electrodes RME #2 face each other while being spaced apart in the second direction DR2, but they may have an asymmetric structure.

For example, the first-type electrodes RME #1 may include a first electrode RME1 and a fourth electrode RME4 disposed on the first banks BNL1. Each of the first electrode RME1 and the fourth electrode RME4 may include a first portion RP1 having a narrow width and a second portion RP2 having a width greater than that of the first portion RP1. The second-type electrode RME #2 may include a second electrode RME2 and a third electrode RME3 disposed on the second bank BNL2. The second electrode RME2 and the third electrode RME3 may have the same width as the second portion RP2 of the first-type electrodes RME #1. The first electrode RME1 and the fourth electrode RME4 may be symmetrical to each other. The first portions RP1 of the first electrode RME1 and the fourth electrode RME4 may be arranged or disposed parallel to each other in the second direction DR2, and the second portions RP2 may also be arranged or disposed parallel to each other in the second direction DR2. First and second portions RP1 and RP2 of the first electrode RME1 and the fourth electrode RME4 may be repeated alternately and the widths thereof may vary along the first direction DR1. For example, while the second-type electrodes RME #2 have a uniform width, the first-type electrodes RME #1 facing them, respectively, have varying widths, and thus they may be asymmetrical to each other.

The shape of the first-type electrodes RME #1 will be described with reference to the first electrode RME1 as an example. The first electrode RME1 may include one or more first portions RP1 disposed in the emission area EMA. The first portions RP1 are spaced apart from one another in the first direction DR1 and the second portion RP2 may be disposed therebetween. In the example shown in FIG. 7, two first portions RP1 are disposed in the emission area EMA, and the second portion RP2 is disposed between them. The second portion RP2 may be located or disposed at the middle of the emission area EMA, while the first portions RP1 may be disposed on the upper and lower sides of the center of the emission area EMA, respectively. It is, however, to be understood that the disclosure is not limited thereto.

According to an embodiment, the distance between the outer side of the both sides of the first-type electrodes RME #1 that does not face the second-type electrodes RME #2 may be constant. The first-type electrodes RME #1 include the first portions RP1 and the second portion RP2 having different widths, and the outer side thereof not facing the second-type electrodes RME #2 may be extended parallel to one side or a side of the second-type electrodes RME #2. For example, the outer side of the first electrode RME1 that does not face the third electrode RME3 may be extended without being recessed or protruding in a certain direction. For example, the sides of the first portions RP1 and the side of the second portion RP2 of the first electrode RME1 that do not face the third electrode RME3 may be in line with each other. Similarly, the sides of the first portions RP1 and the side of the second portion RP2 of the fourth electrode RME4 that do not face the second electrode RME2 may be in line with each other. The distance between the outer side of the first electrode RME1 and the third electrode RME3 may be equal to the distance between the second electrode RME2 and the outer side of the fourth electrode RME4.

On the contrary, the inner side of the both sides of the first-type electrodes RME #1 facing the second-type electrodes RME #2 has a shape protruding or recessed in a certain direction, and thus the width of the first-type electrodes RME #1 may vary. For example, the distance between the electrodes RME spaced apart from each other in the second direction DR2 may be generally constant, but the width of the first electrodes RME1 may vary depending on the position.

The width of the first portions RP1 may be the minimum width of the first-type electrodes RME #1 while the width of the second portions RP2 may be the maximum width of the first-type electrodes RME #1, which may be equal to the width of the second-type electrodes RME #2. The first electrode RME1 and the fourth electrode RME4 may have the width equal to the width of the second electrode RME2 and the third electrode RME3 except for the first portions RP1, which may have a smaller width.

According to an embodiment, the inner side of the first portions RP1 of the first-type electrodes RME #1 facing the second-type electrodes RME #2 may have an inclined shape, and may have a recessed shape substantially like a triangle when viewed from the top. The first portions RP1 of the first electrode RME1 and the fourth RME4, which are the first-type electrodes RME #1, may have the minimum width at the point where the inclined surfaces of the inner side of the first portions RP1 meet each other. The width of the first portions RP1 of each of the first electrode RME1 and the third electrode RME3, which are the first-type electrodes RME #1, may gradually decrease and increase from the point where the inclined surfaces meet each other. It is, however, to be understood that the disclosure is not limited thereto.

The light-emitting diodes ED may be disposed on the electrodes RME. The light-emitting diodes ED are dispersed in an ink, and their positions and orientations may be changed by an electric field generated over the electrode RME. Electric signal applied to the electrodes RME may generate an electric field in the ink containing the light-emitting diodes ED located or disposed on the electrodes RME. The light-emitting diodes ED may flow according to the intensity of the electric field. The intensity of the electric field may be determined based on the distance between the electrodes RME, and thus the light-emitting diodes ED may flow accordingly. In the display device 10 according to an embodiment, one electrode (for example, the first-type electrodes) may have partially different widths compared to an electrode (for example, the second-type electrodes) facing it. Accordingly, during the process of arranging the light-emitting diodes ED, the light-emitting diodes ED can be controlled so that they flow in an intended direction, thereby guiding the light-emitting diodes ED so that they are aligned at a particular location.

In this manner, most of the light-emitting diodes ED can be densely disposed on the second portion RP2 of the first-type electrodes RME #1, rather than the first portions RP1. The number, density or concentration degree of the light-emitting diodes ED disposed on the second portion RP2 of the first-type electrodes RME #1 may be different from the density of the light-emitting diodes ED disposed on the first portions RP1. A more detailed description thereon will be given later.

The first insulating layer PAS1 is disposed on the electrodes RME and the first banks BNL1. The first insulating layer PAS1 may be disposed to entirely cover or overlap the electrodes RME and the first bank BNL1, and can protect the electrodes RME while insulating them from one another. The first insulating layer PAS1 can also prevent that the light-emitting diodes ED disposed thereon are brought into contact with other elements and damaged.

In an embodiment, the first insulating layer PAS1 may have steps so that a portion of the upper surface is recessed between the electrodes RME spaced apart from one another in the second direction DR2. The light-emitting diodes ED may be disposed at the steps of the upper surface of the first insulating layer PAS1, and space may be formed between the light-emitting diodes ED and the first insulating layer PAS1. It is, however, to be understood that the disclosure is not limited thereto.

The first insulating layer PAS1 may include contacts CT1 and CT2 exposing a portion of the upper surface of each of the electrodes RME. The contacts CT1 and CT2 may penetrate through the first insulating layer PAS1, and the contact electrodes CNE described later may be in contact with the electrodes RME exposed through the contacts CT1 and CT2.

According to an embodiment, the contacts CT1 and CT2 penetrating through the first insulating layer PAS1 may be formed in the subsidiary area SA of each of the sub-pixels PXn. The contacts CT1 and CT2 may penetrate through the first insulating layer PAS1 to expose a portion of the upper surfaces of the electrodes RME. As described above, during the process of fabricating the display device 10, the light-emitting diodes ED dispersed in an ink may be ejected onto the electrodes RME, and aligned by an electric field E applied to the electrodes RME. The first insulating layer PAS1 is disposed to cover or overlap the electrodes RME including the contacts CT1 and CT2. In case that the upper surfaces of the electrodes RME are exposed by the contacts CT1 and CT2, the electric field E generated in the contacts CT1 and CT2 may have a stronger intensity than other portions. In the display device 10 according to an embodiment, the contacts CT1 and CT2 are formed in the subsidiary area SA rather than the emission area EMA, a region where the intensity of the electric field E is stronger due to the contacts CT1 and CT2 may not be formed in the emission area EMA. Accordingly, it is possible to prevent that the light-emitting diodes ED are concentrated in an undesired area in the emission area EMA.

The third bank BNL3 may be disposed on the first insulating layer PAS1. The third bank BNL3 may be disposed in a lattice pattern including parts extended in the first direction DR1 and the second direction DR2 when viewed from the top, and may be disposed at the boundaries of the sub-pixels PXn to distinguish the adjacent sub-pixels PXn from each other. The third bank BNL3 may be disposed to surround the emission area EMA and the subsidiary area SA disposed in each of the sub-pixels PXn to distinguish them. The third bank BNL3 may have a height greater than that of each of the first bank BNL1 and the second bank BNL2. The third bank BNL3 can prevent the ink in which different light-emitting diodes ED are dispersed from overflowing to adjacent sub-pixels PXn during the inkjet printing process of the processes of fabricating the display device 10, so that different sub-pixels PXn can be separated from one another and the ink is not mixed. The third bank BNL3 may include, but is not limited to, polyimide (PI), like the first banks BNL1.

A portion of the third bank BNL3 extended in the second direction DR2 may overlap the first bank BNL1 and the second bank BNL2. A portion of the third bank BNL3 that overlaps with the first banks BNL1 and the second bank BNL2 may be higher than the other portions. As will be described later, contact electrodes CNE may be disposed on the portion of the third bank BNL3 that overlaps the first banks BNL1 and the second bank BNL2, and it is possible to prevent that adjacent contact electrodes CNE create a short circuit as the third bank BNL3 is higher than them.

The light-emitting diodes ED may be disposed on the first insulating layer PAS1. The light-emitting diodes ED may be spaced apart from one another in the first direction DR1 in which the electrodes RME are extended, and may be aligned substantially parallel to one another. The light-emitting elements ED may have a shape extended in one direction. The direction in which the electrodes RME are extended may be substantially perpendicular to the direction in which the light-emitting diodes ED are extended. It is, however, to be understood that the disclosure is not limited thereto. The light-emitting diodes ED may be oriented obliquely to the direction in which the electrodes RME are extended.

The light-emitting diode ED may include semiconductor layers doped to have different conductivity types. The light-emitting diodes ED may include multiple semiconductor layers and may be aligned so that their ends are directed in a particular orientation depending on the direction of the electric field generated over the electrodes RME. Each of the light-emitting diodes ED may include an emissive layer 36 (see FIG. 6) to emit light of a wavelength band. The light-emitting diodes ED disposed in each of the sub-pixels PXn may emit light of different wavelength bands depending on the material of the emissive layer 36. It is, however, to be understood that the disclosure is not limited thereto. The light-emitting diodes ED disposed in the sub-pixels PXn may emit light of the same color.

The light-emitting diodes ED may include multiple layers disposed on the upper surface of the first substrate SUB in the direction parallel to it. The light-emitting diodes ED of the display device 10 may be arranged or disposed such that they are extended in parallel to the first substrate SUB. The multiple semiconductor layers included in the light-emitting elements 30 may be disposed sequentially in the direction parallel to the upper surface of the first substrate SUB. It is, however, to be understood that the disclosure is not limited thereto. In some implementations, in case that the light-emitting diodes ED have a different structure, layers may be disposed in a direction perpendicular to the first substrate SUB.

The light-emitting diodes ED may be disposed on the electrodes RME spaced apart from each other between the first banks BNL1 and the second bank BNL2 in the second direction DR2. The length of the light-emitting diodes ED may be larger than the distance between the electrodes RME spaced apart from each other in the second direction DR2, and the both ends of the light-emitting diodes ED may be disposed on different electrodes, respectively. The light-emitting diodes ED may have first ends disposed on the first-type electrodes RME #1 and second ends disposed on the second-type electrodes RME #2. The light-emitting diodes ED may include light-emitting diode groups ED #1 and ED #2 disposed adjacent to each other according to positions where the first portions RP1 of the first-type electrodes RME #1 are disposed.

The light-emitting diode groups ED #1 and ED #2 may be spaced apart from each other in the first direction DR1. For example, the light-emitting diodes ED may include first light-emitting diodes ED1 having both ends disposed on the first electrode RME1 and the third electrode RME3, respectively, and second light-emitting diodes ED2 having both ends disposed on the second electrode RME2 and the fourth electrode RME4, respectively, as the first light-emitting diode group ED #1. The light-emitting diodes ED may include third light-emitting diodes ED3 having both ends disposed on the first electrode RME1 and the third electrode RME3, respectively, and fourth light-emitting diodes ED4 having both ends disposed on the second electrode RME2 and the fourth electrode RME4, respectively, as the second light-emitting diode group ED #2, which is spaced apart from the first light-emitting diode group ED #1 in the first direction DR1.

As used herein, the term "density" or "concentration degree" of light-emitting diodes is related to the number of light-emitting diodes ED disposed on the electrodes RME. The term may define the number or distribution of the light-emitting diodes ED disposed per area defined on the electrodes RME. The term "density" may not mean an absolute value, and may be defined to roughly compare the numbers of light-emitting diodes ED between certain areas.

Each of the light-emitting diodes ED may include semiconductor layers, and a first end and a second end opposite to the first end may be defined based on one of the semiconductor layers. Each of the light-emitting diodes ED may be disposed such that the first end and the second end are placed on the respective electrodes RME. For example, the first light-emitting diode ED1 may be disposed such that the first end is placed on the first electrode RME1 and the second end is placed on the third electrode RME3. The second light-emitting diode ED2 may be disposed such that the first end is placed on the fourth electrode RME4 and the second end is placed on the second electrode RME2. Each of the light-emitting diodes ED may have the first end and the second end electrically connected to different electrodes RME. It is, however, to be understood that the disclosure is not limited thereto. At least some or a number of the light-emitting diodes ED may be disposed such that only one ends are placed on the electrodes RME or the first ends and the second ends may be switched depending on the orientation between the electrodes RME.

The both ends of each of the light-emitting diodes ED may be in contact with the contact electrodes CNE, respectively. As a portion of the semiconductor layer or an electrode layer of each of the light-emitting diodes ED is exposed because the insulating film 38 (see FIG. 6) is not formed at the end surface on the side of the extending direction, the exposed portion of the semiconductor layer or the electrode layer may be in contact with the contact electrode CNE. It is, however, to be understood that the disclosure is not limited thereto. In some implementations, at least a portion of the insulating film 38 is removed, and thus the end surfaces of the semiconductor layer or the electrode layer may be partially exposed. The exposed side surfaces of the semiconductor layer or the electrode layer may be in direct contact with the contact electrodes CNE. The both ends of the light-emitting diodes ED may be electrically connected to the electrodes RME through different contact electrodes CNE, respectively, The second insulating layer PAS2 may be partially disposed on the first insulating layer PAS1 and the light-emitting diodes ED. For example, the second insulating layer PAS2 may be disposed to partially surround the outer surfaces of the light-emitting diodes ED so that the first end and the second end of each of the light-emitting diodes ED are not covered or overlapped. The portion of the second insulating layer PAS2 which is disposed on the light-emitting diodes ED may be extended in the second direction DR2 on the first insulating layer PAS1 when viewed from the top, thereby forming a linear or island-like pattern in each of the sub-pixels PXn. The second insulating layer PAS2 can protect the light-emitting diodes ED and fix the light-emitting diodes ED during the process of fabricating the display device 10. The second insulating layer PAS2 may be disposed to fill the space between light-emitting diodes ED and the first insulating layer PAS1 thereunder.

The second insulating layer PAS2 may be disposed also on the first bank BNL1, the second bank BNL2 and the third bank BNL3. The second insulating layer PAS2 may be disposed on the first insulating layer PAS1 and the third bank BNL3, and may be disposed to expose some or a number of parts where the electrodes RME are disposed together with the both ends of the light-emitting diodes ED. The second insulating layer PAS2 may have such a shape as it is formed entirely on the first insulating layer PAS1 during the process of fabricating the display device 10 and is removed during the process of exposing both ends of the light-emitting diodes ED.

Although not shown in the drawings, a portion of the second insulating layer PAS2 may be disposed in the subsidiary area SA. The electrodes RME disposed in the sub-pixels PXn may be formed as continuous electrodes extended in the second direction DR2, and may be separated into parts in the subsidiary area SA after the light-emitting diodes ED have been aligned and the second insulating layer PAS2 has been formed. During the process of separating the electrodes RME, the first insulating layer PAS1 and the second insulating layer PAS2 may be partially removed, in addition to the electrodes RME.

Contact electrodes CNE and a third insulating layer PAS3 may be disposed on the second insulating layer PAS2. The contact electrodes CNE may be in contact with one ends of the light-emitting diodes ED and at least one electrode RME. For example, the contact electrodes CNE may be in contact with one ends of the light-emitting diodes ED exposed where the second insulating layer PAS2 is not disposed, and with at least one of the electrodes RME through the contacts CT1 and CT2 that are formed in the first insulating layer PAS1 and expose portions of the electrodes RME.

According to an embodiment, the contact electrodes CNE of the display device 10 may be sorted into first-type contact electrodes disposed only on the electrodes RME electrically connected or directly connected to the fourth conductive layer, and second-type contact electrodes disposed also on the electrodes RME not electrically connected or directly connected to the fourth conductive layer. The first-type contact electrodes may electrically connect some or a number of the light-emitting diodes ED with the electrodes RME, and the second-type contact electrodes may electrically connect between substantially different light-emitting diodes ED.

For example, the contact electrodes CNE may include a first contact electrode CNE1 and a second contact electrode CNE2 as the first-type contact electrodes disposed on the first electrode RME1 or the second electrode RME2. The first contact electrode CNE1 and the second contact electrode CNE2 may be disposed on portions of the first electrode RME1 and the second electrode RME2, respectively. Each of the first contact electrode CNE1 and the second contact electrode CNE2 may be extended in the first direction DR1, and they may form a linear pattern in each of the sub-pixels PXn. A portion of each of the first contact electrode CNE1 and the second contact electrode CNE2 may be disposed in the subsidiary area SA beyond the third bank BNL3. In the subsidiary area SA, the first contact electrode CNE1 may be in contact with the first electrode RME1 through the first contact CT1 exposing the upper surface of the first electrode RME1, and the second contact electrode CNE2 may be in contact with the second electrode RME2 through the first contact CT1 exposing the upper surface of the second electrode RME2.

The first contact electrode CNE1 may be in contact with the first end of the first light-emitting diode ED1, and the second contact electrode CNE2 may be in contact with the second end of the second light-emitting diode ED2. The first contact electrode CNE1 and the second contact electrode CNE2, which are the first-type contact electrodes, may transmit electric signals applied to the first-type electrodes to one of the ends of each of the light-emitting diodes ED. The electric signal may be applied or directly applied to the first end of the first light-emitting diode ED1 and the second end of the second light-emitting diode ED2. The electric signal may be transmitted to other contact electrodes CNE and the light-emitting diodes ED through the second end of the first light-emitting diode ED1 and the first end of the second light-emitting diode ED2.

The contact electrodes CNE are the second-type contact electrodes disposed across different electrodes RME, and may include a third contact electrode CNE3, a fourth contact electrode CNE4 and a fifth contact electrode CNE5.

The third contact electrode CNE3 may be disposed on the third electrode RME3 and the first electrode RME1. The third contact electrode CNE3 may include a first extension CN_E1 and a second extension CN_E2 extended in the first direction DR1, and a first bridge CN_B1 electrically connecting the first extension CN_E1 with the second extension CN_E2 in the emission area EMA. The third contact electrode CNE3 may be generally extended in the first direction DR1 and may have a bent shape so that it can be disposed on the third electrode RME3 and the first electrode RME1. The first extension CN_E1 may be disposed on the third electrode RME3 to be in contact with the second ends of the first light-emitting diodes ED1. The second extension CN_E2 may be disposed on the first electrode RME1 to be spaced apart from the first contact electrode CNE1 in the first direction DR1 and may be in contact with the first ends of the third light-emitting diodes ED3. The first bridge CN_B1 may be disposed across the first electrode RME1 and the third electrode RME3. The first extension CN_E1 of the third contact electrode CNE3 may be disposed also in the subsidiary area SA beyond the third bank BNL3. The third contact electrode CNE3 may be in contact with the third electrode RME3 through the second contact CT2 exposing the upper surface of the third electrode RME3 in the subsidiary area SA.

The fourth contact electrode CNE4 may be disposed on the third electrode RME3 and the fourth electrode RME4. The fourth contact electrode CNE4 may include a third extension CN_E3 and a fourth extension CN_E4 extended in the first direction DR1, and a second bridge CN_B2 electrically connecting the third extension CN_E3 with the fourth extension CN_E4 in the emission area EMA. The third extension CN_E3 may be disposed on the third electrode RME3 to be in contact with the second ends of the third light-emitting diodes ED3. The fourth extension CN_E4 may be disposed on the fourth electrode RME4 to be in contact with the first ends of the fourth light-emitting diodes ED4. The second bridge CN_B2 is disposed across the third electrode RME3, the second electrode RME2 and the fourth electrode RME4. The second bridge CN_B2 is disposed on one side or a side of the emission area EMA adjacent to another sub-pixel PXn to electrically connect the third extension CN_E3 with the fourth extension CN_E4. The fourth contact electrode CNE4 may have a shape surrounding a fifth extension CN_E5 of the fifth contact electrode CNE5. Unlike other contact electrodes, the fourth contact electrode CNE4 may be disposed only in the emission area EMA and may not be electrically connected or directly connected with the electrodes RME.

The fifth contact electrode CNE5 may have a shape similar to that of the third contact electrode CNE3 and may be disposed on the second electrode RME2 and the fourth electrode RME4. The fifth contact electrode CNE5 may include a fifth extension CN_E5 and a sixth extension CN_E6 extended in the first direction DR1, and a third bridge CN_B3 electrically connecting the fifth extension CN_E5 with the sixth extension CN_E6 in the emission area EMA. The fifth extension CN_E5 may be disposed on the second electrode RME2 to be spaced apart from the second contact electrode CNE2 in the first direction DR1 and may be in contact with the second ends of the fourth light-emitting diodes ED4. The sixth extension CN_E6 may be disposed on the fourth electrode RME4 to be spaced apart from the fourth extension CN_E4 in the first direction DR1 and may be in contact with the first ends of the second light-emitting diodes ED2. The third bridge CN_B3 may be disposed across the second electrode RME2 and the fourth electrode RME4. The sixth extension CN_E6 of the fifth contact electrode CNE5 may be disposed also in the subsidiary area SA beyond the third bank BNL3. The fifth contact electrode CNE5 may be in contact with the fourth electrode RME4 through the second contact CT2 exposing the upper surface of the fourth electrode RME4 in the subsidiary area SA.

The first light-emitting diode ED1 and the third light-emitting diode ED3 may be electrically connected to each other through the third contact electrode CNE3. The electric signal applied through the first contact electrode CNE1 may be transmitted to the third light-emitting diode ED3 through the first light-emitting diode ED1 and the third contact electrode CNE3. The first light-emitting diodes ED1 and the third light-emitting diodes ED3 are disposed on the first electrode RME1 and the third electrode RME3, respectively, and may be in contact with different contact electrodes CNE. They may be electrically connected to each other in series through the third contact electrode CNE3 which is one of the second-type contact electrodes. Similarly, the third light-emitting diodes ED3 and the fourth light-emitting diodes ED4 may be electrically connected with each other through the fourth contact electrode CNE4, and the fourth light-emitting diodes ED4 and the second light-emitting diodes ED2 may be electrically connected with each other through the fifth contact electrode CNE5.

Incidentally, the contacts CT1 and CT2 formed at such locations that the contact electrodes CNE and the electrodes RME are in contact with each other may not overlap the light-emitting diodes ED in the second direction DR2. The contacts CT1 and CT2 may be formed in the subsidiary area SA such that they are spaced apart in the first direction DR1 from the area where light-emitting diodes ED are disposed. Lights are emitted from the both ends of the light-emitting diodes ED, and the contacts CT1 and CT2 may be located or disposed to avoid the paths of the lights. It is, however, to be understood that the disclosure is not limited thereto. The locations of the contacts CT1 and CT2 may vary depending on the structure of the electrodes RME and the locations of the light-emitting diodes ED.

The contact electrodes CNE may include a conductive material. For example, the connection electrodes CNE may include ITO, IZO, ITZO, aluminum (Al), etc. within the spirit and the scope of the disclosure. For example, the contact electrodes CNE may include a transparent conductive material, and light emitted from the light-emitting diodes ED may transmit the contact electrodes CNE to proceed toward the electrodes RME. It is, however, to be understood that the disclosure is not limited thereto.

The third insulating layer PAS3 is disposed on the third contact electrode CNE3 and the fifth contact electrode CNE5. The third insulating layer PAS3 may also be disposed on the second insulating layer PAS2 except for areas where the first contact electrode CNE1, the second contact electrode CNE2 and the fourth contact electrode CNE4 are disposed. The third insulating layer PAS3 may insulate the contact electrodes CNE disposed on different layers from each other so that they are not in direct contact with each other. It is to be noted that the third insulating layer PAS3 may be eliminated and the contact electrodes CNE may be disposed on substantially the same layer.

The display device 10 may include the third insulating layer PAS3, and some or a number of the contact electrodes CNE may be disposed on the same layer while some or a number of others may be disposed on a different layer. For example, the third contact electrode CNE3 and the fifth contact electrode CNE5 may be disposed on the second insulating layer PAS2, while the first contact electrode CNE1, the second contact electrode CNE2, and the four contact electrode CNE4 may be disposed on the third insulating layer PAS3. The third contact electrode CNE3 and the fifth contact electrode CNE5 may be disposed on exposed portions of the patterned second insulating layer PAS2, while the first contact electrode CNE1, the second contact electrode CNE2 and the four contact electrode CNE4 may be disposed on exposed portions of the patterned second insulating layer PAS2 and the patterned third insulating layer PAS3. It is to be noted that the first contact electrode CNE1, the second contact electrode CNE2 and the fourth contact electrode CNE4 may be disposed on or directly on the first insulating layer PAS1 where the second insulating layer PAS2 and the third insulating layer PAS3 are not disposed and the both ends of the light-emitting diodes ED are exposed.

Although not shown in the drawings, an insulating layer may be further disposed on the contact electrodes CNE, the third insulating layer PAS3 and the third bank BNL3 to cover or overlap them. The insulating layer may be disposed entirely on the first substrate SUB to protect the elements disposed thereon against the external environment.

Each of the above-described first insulating layer PAS1, second insulating layer PAS2 and third insulating layer PAS3 may include an inorganic insulating material or an organic insulating material. It is, however, to be understood that the disclosure is not limited thereto.

Figure 6:
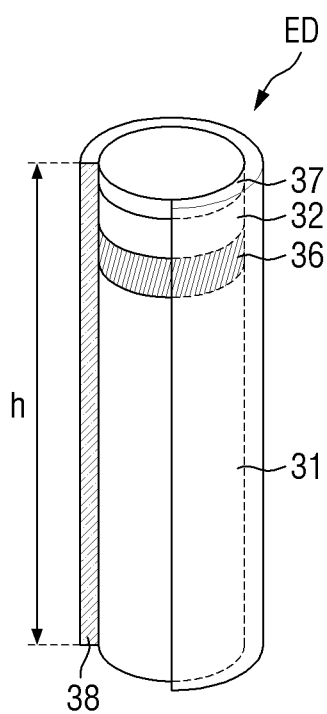
FIG. 6 is a view showing a light-emitting element according to an embodiment.

FIG. 6 is a view showing a light-emitting element according to an embodiment.

Referring to FIG. 6, a light-emitting element ED may be a light-emitting diode. For example, the light-emitting element ED may have a size from nanometers to micrometers and may be an inorganic light-emitting diode made of an inorganic material. The light-emitting diode ED may be aligned between two electrodes facing each other as polarities are created by forming an electric field in a particular direction between the two electrodes.

The light-emitting diode ED according to an embodiment may have a shape extended in one direction. The light-emitting element ED may have a shape substantially of a cylinder, substantially a rod, substantially a wire, a tube, etc. within the spirit and the scope of the disclosure. It is to be understood that the shape of the light-emitting diode ED is not limited thereto. The light-emitting diode ED may have a variety of shapes including a substantially polygonal column shape such as substantially a cube, substantially a cuboid and substantially a hexagonal column, or a shape that is extended in a direction with partially inclined outer surfaces.

The light-emitting diode ED may include semiconductor layers doped with impurities of a conductive type (for example, p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38. The light-emitting diode ED may have a height h.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The n-type dopant doped into the first semiconductor layer 31 may be Si, Ge, Sn, etc. within the spirit and the scope of the disclosure. It is, however, to be understood that the disclosure is not limited thereto. A first end of the light-emitting diode ED may refer to the side of the emissive layer 36 where the first semiconductor layer 31 is disposed.

The second semiconductor layer 32 is disposed on the emissive layer 36 to be described later. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN and InN. The p-type dopant doped into the second semiconductor layer 32 may be Mg, Zn, Ca, Se, Ba, etc. within the spirit and the scope of the disclosure. It is, however, to be understood that the disclosure is not limited thereto. A second end of the light-emitting element ED may refer to the other side of the emissive layer 36 where the second semiconductor layer 32 is disposed.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, for example, a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. In case that the emissive layer 36 may include a material having the multiple quantum well structure, the structure may include quantum layers and well layers alternately stacked each other. The emissive layer 36 may emit light as electron-hole pairs are combined therein in response to an electrical signal applied through the first semiconductor layer 31 and the second semiconductor layer 32. The emissive layer 36 may include a material such as AlGaN and AlGaInN. In case that the emissive layer 36 has a multi-quantum well structure in which quantum layers and well layers may be alternately stacked each other, the quantum layers may include AlGaN or AlGaInN, and the well layers may include a material such as GaN and AlGaN.

It is, however, to be understood that the disclosure is not limited thereto. The emissive layer 36 may have a structure in which a semiconductor material having a large band gap energy and a semiconductor material having a small band gap energy may be alternately stacked each other, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic contact electrode. It is, however, to be understood that the disclosure is not limited thereto. The element electrode layer may be Schottky contact electrodes. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting element ED and the electrodes or the contact electrodes in case that the light-emitting element ED is electrically connected to the electrodes or the contact electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO. It is, however, to be understood that the disclosure is not limited thereto.

The insulating film 38 is disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. A portion of the upper surface of the insulating film 38 may be rounded in cross section, which is adjacent to at least one of the ends of the light-emitting diode ED.

The insulating film 38 may include materials having insulating properties such as silicon oxide (SiOx), silicon nitride (SiNx), silicon oxynitride (SiOxNy), aluminum nitride (AlNx) and aluminum oxide (AlOx). Although the insulating film 38 is formed as a single layer in the drawings, the disclosure is not limited thereto. In an embodiment, the insulating film 38 may be formed as a multilayer structure in which multiple layers may be stacked each other.

The insulating film 38 may serve to protect the above-described elements. The insulating film 30 can prevent an electrical short-circuit that may occur in the emissive layer 36 if it comes in direct contact with an electrode through which an electric signal is transmitted to the light-emitting diode ED. The insulating film 38 can prevent a decrease in luminous efficiency.

The outer surface of the insulating film 38 may be subjected to surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

According to an embodiment, the display device 10 may include the electrodes RME having the asymmetric structure to guide the light-emitting diodes ED so that they are concentrated at an intended position. This can be achieved by utilizing the intensity of electric field according to the structure of the electrode RME after the ink containing the light-emitting diode ED are ejected onto the electrodes RME during the process of fabricating the display device 10.

Figure 7:
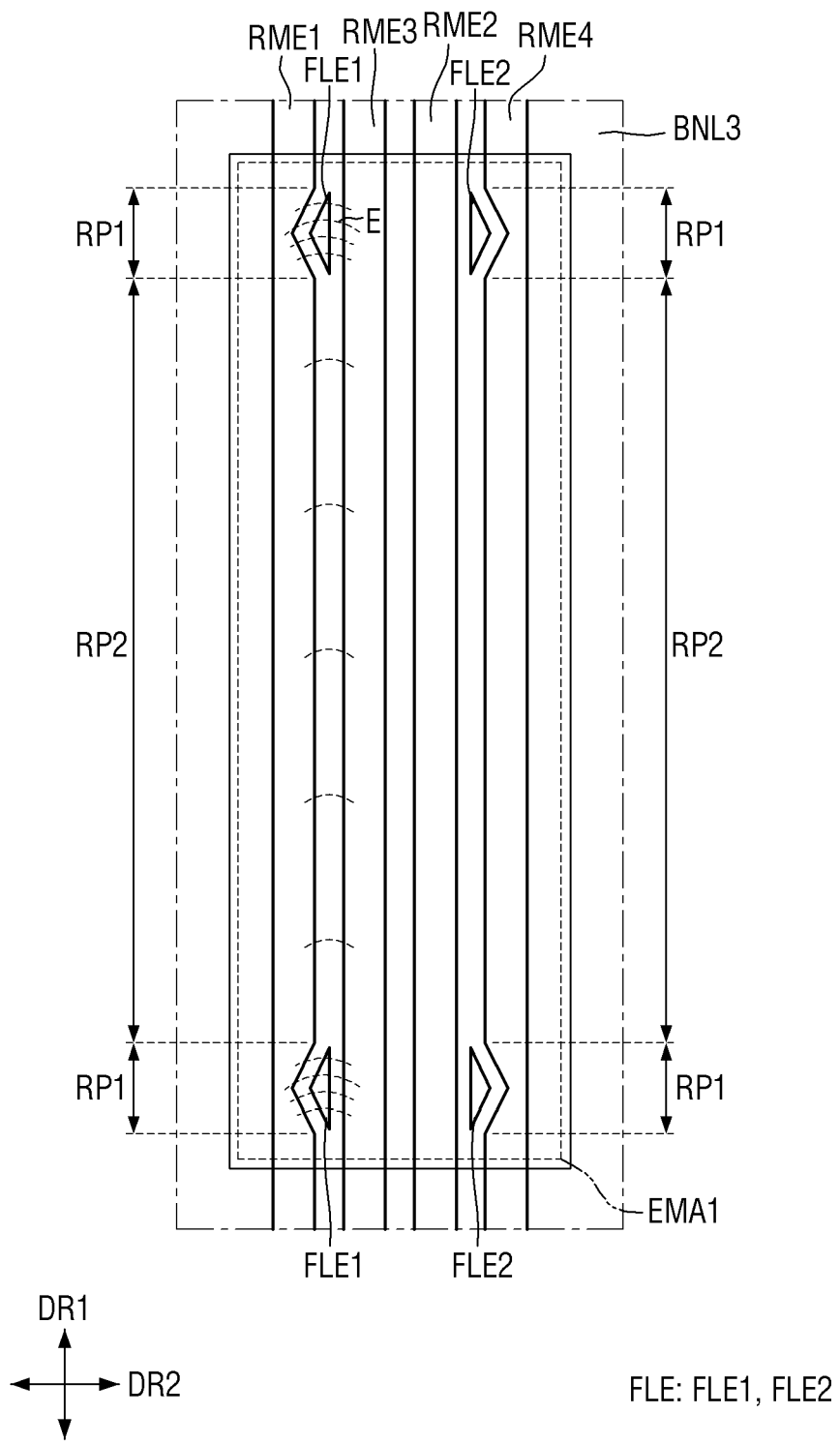
FIG. 7 is a schematic plan view schematically showing electrodes of a display device according to an embodiment.

FIG. 7 is a schematic plan view schematically showing electrodes of a display device according to an embodiment.

Referring to FIG. 7 in conjunction with FIG. 3, as described above, the electrodes RME may include electrodes RME having the symmetrical structure to guide the light-emitting diodes ED to be concentrated at a particular location.

The electrodes RME may be electrically connected to transistors or voltage lines through a first electrode contact hole CTD and a second electrode contact hole CTS in the subsidiary area SA, so that an electric signal for generating an electric field may be applied thereto. The magnitude of the voltage is large and thus the electric field is strong at the first electrode contact hole CTD and the second electrode contact hole CTS because the electric signal is applied or directly applied to the electrodes RME there. As a result, the electric field strongly affects the edges of the electrodes RME adjacent to the first electrode contact hole CTD and the second electrode contact hole CTS in the emission area EMA, and thus the light-emitting diodes ED may gather at the edges and sticking together.

According to the embodiment, it is possible to prevent that the light-emitting diodes ED gather at the edges of the emission area EMA and stick together by way of reducing the intensity of the electric field over the electrodes RME at the edges of the emission area EMA.

For example, the width of the first-type electrodes RME #1 may vary along the second direction DR2 and thus may be different depending on the positions. Each of the first electrode RME1 and the fourth electrode RME4 may include first portions RP1 having a narrow width and a second portion RP2 having a width greater than that of the first portions RP1. The inner side of the first portions RP1 of the first electrode RME1 that faces the third electrode RME3 may be inclined inward in the second direction DR2 from the inner side of the second portion RP2 toward the outer side of the first portions RP1. The inner side of the first portions RP1 of the fourth electrode RME4 that faces the second electrode RME2 may be inclined inward toward the outer side of the first portions RP1.

The first electrode RME1 and the third electrode RME3 will be described as an example. The distance between the inner side of the first portions RP1 and the third electrode RME3 gradually increases along the first direction DR1 and gradually decreases from the point where the inclined surfaces meet each other. On the contrary, the distance between the inner side of the second portion RP2 and the third electrode RME3 is constant. The distance between the inner side of the first portions RP1 and the third electrode RME3 may be longer than the distance between the inner side of the second portion RP2 and the third electrode RME3. Accordingly, in case that an electric field is generated between the first electrode RME1 and the third electrode RME3, the electric field is constant between the inner side of the second portion RP2 and the third electrode RME3, whereas the electric field becomes gradually weaker as the distance between the inner side of the first portions RP1 and the third electrode RME3 increases and becomes stronger gradually therebetween. However, the maximum intensity of the electric field between the inner side of the first portions RP1 and the third electrode RME3 is less than the intensity of the electric field between the inner side of the second portion RP2 and the third electrode RME3.

In case that the ink containing the light-emitting diodes ED is disposed on the electrodes RME, the light-emitting diodes ED gather to a position where the electric field is stronger. For example, since the intensity of the electric field is greatest between the second portion RP2 and the third electrode RME3, the light-emitting diodes ED may gather at the middle of the emission area EMA. The density of the light-emitting diodes ED is relatively low between the first portions RP1 of the first electrode RME1 and the third electrode RME3 where the intensity of the electric field is relatively weak. In this manner, it is possible to prevent the light-emitting diodes ED from gathering at the edges of the emission area EMA, and to align them at the middle of the emission area EMA.

According to an embodiment, the first-type electrodes RME #1 may include floating electrodes FLE adjacent to the first portions RP1 facing the second-type electrodes RME #2. A first floating electrode FLE1 may be disposed between the first portions RP1 of the first electrode RME1 and the third electrode RME3, and the second floating electrode FLE2 may be disposed between the first portions RP1 of the fourth electrode RME4 and the second electrodes RME2. The distance between the inner side of the first portions RP1 and the third electrode RME3 may be longer than the distance between the inner side of the second portion RP2 and the third electrode RME3. The distance between the inner side of the first portions RP1 and the third electrode RME3 may be measured over the first floating electrode FLE1.

No electric signal is applied to the floating electrodes FLE and thus they may be in a floating state. The floating electrodes FLE may be arranged or disposed in an island or isolated pattern. The floating electrodes FLE may be made of the same material or similar material as the electrodes RME and may be formed together with them. In case that an electric field is generated between the first portions RP1 of the first electrode RME1 and the third electrode RME3 and between the first portions RP1 of the fourth electrode RME4 and the second electrode RME2, the floating electrodes FLE can shield the electric field to reduce the strength of the electric field.

The floating electrodes FLE may have a shape conforming to the shape of the recessed inner side of the first portions RP1 when viewed from the top. For example, in case that the shape of the recessed inner side of the first portions RP1 is a triangle when viewed from the top as shown in FIG. 7, the shape of the floating electrodes FLE may be a triangle as well. It is, however, to be understood that the disclosure is not limited thereto.

Figure 8:
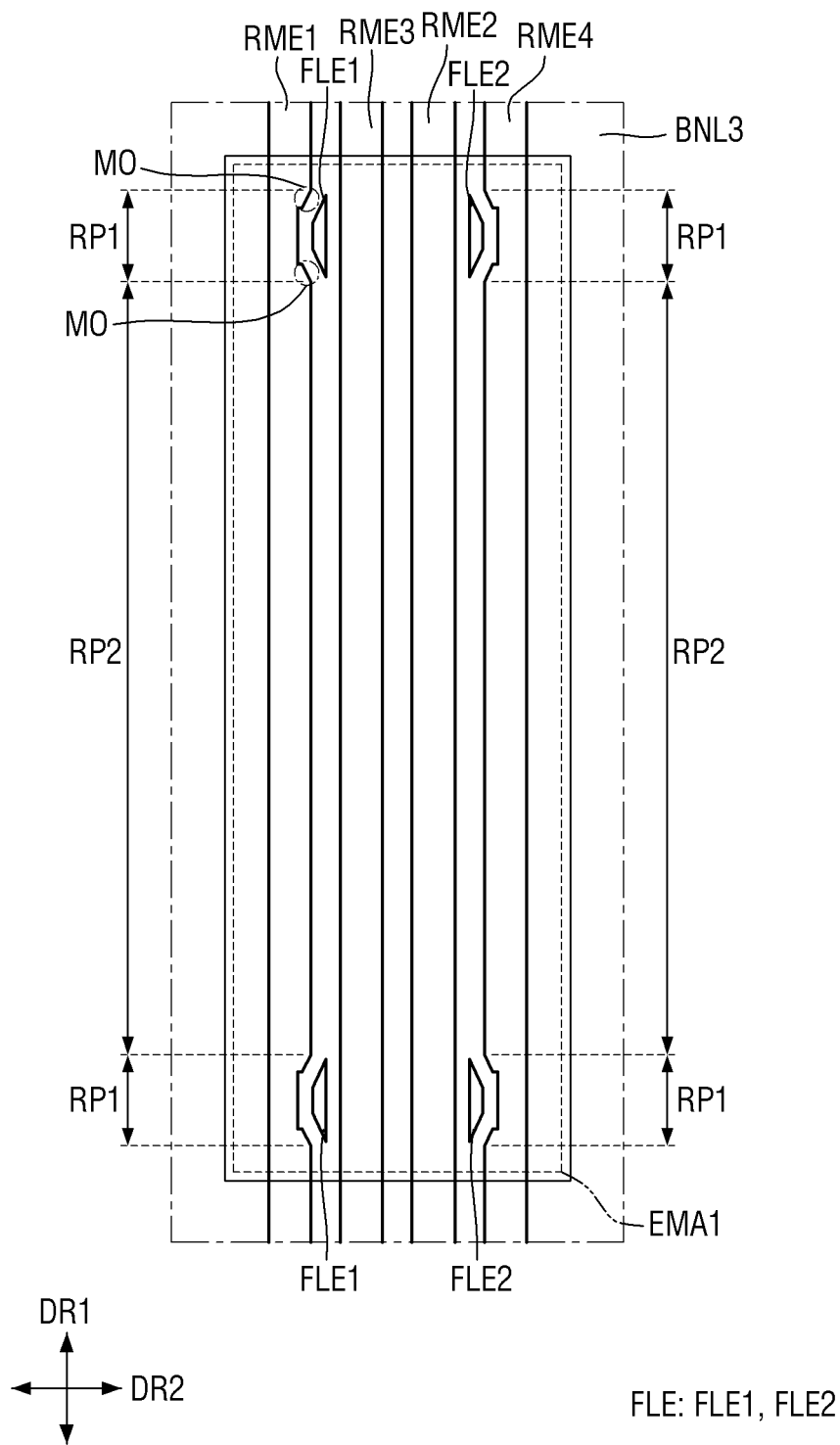
FIG. 8 is a schematic plan view schematically showing electrodes of a display device according to an embodiment.

FIG. 8 is a schematic plan view schematically showing electrodes of a display device according to an embodiment. The embodiment of FIG. 8 is different from the embodiment of FIG. 7 in that the electrodes have different shapes. The embodiment of FIG. 8 is substantially identical to the embodiment of FIG. 3 except for the shapes of the electrodes; and, therefore, the redundant descriptions will be omitted.

Referring to FIG. 8 in conjunction with FIG. 3, the width of the first-type electrodes RME #1 may vary along the second direction DR2 and thus may be different depending on the positions. Each of the first electrode RME1 and the fourth electrode RME4 may include first portions RP1 having a narrow width and a second portion RP2 having a width greater than that of the first portions RP1. The inner side of the first portions RP1 of the first electrode RME1 that faces the third electrode RME3 may be inclined inward toward the outer side of the first portions RP1. The inner side of the first portions RP1 of the fourth electrode RME4 that faces the second electrode RME2 may be inclined inward toward the outer side of the first portions RP1.

The first electrode RME1 and the third electrode RME3 will be described as an example. The distance between the inner side of the first portions RP1 and the third electrode RME3 gradually increases along the first direction DR1 and gradually decreases from the point where the inclined surfaces meet each other. The inner side of the first electrode RME1 extended from the second portion RP2 is bent at the first portions RP1 to be recessed.

The corners of the inner side of the first portions RP1 at which the inner side is bent may be chamfered, for example, the inner side may include chamfered corners MO.

Likewise, the inner side of the fourth electrode RME4 extended from the second portion RP2 may be bent at the first portions RP1 to be recessed. The corners of the inner side of the first portions RP1 may be chamfered, for example, the inner side may include chamfered corners MO. The chamfered corners MO of the inner side of the first portions RP1 can prevent that the electric field is concentrated and becomes strong between the first portions RP1 and the third electrode RME3_2 which may occur in case that the inner side has corners at the right angle.

According to an embodiment, the first-type electrodes RME #1 may include floating electrodes FLE adjacent to the first portions RP1 facing the second-type electrodes RME #2. The floating electrodes FLE may have a shape conforming to the shape of the recessed inner side of the first portions RP1 when viewed from the top. At least one side or a side of each of the floating electrodes FLE may include an inclined surface parallel to the chamfered corners MO of the first portions RP1, so that the distance between the first portions RP1 and the floating electrodes FLE can be maintained.

Figure 9:
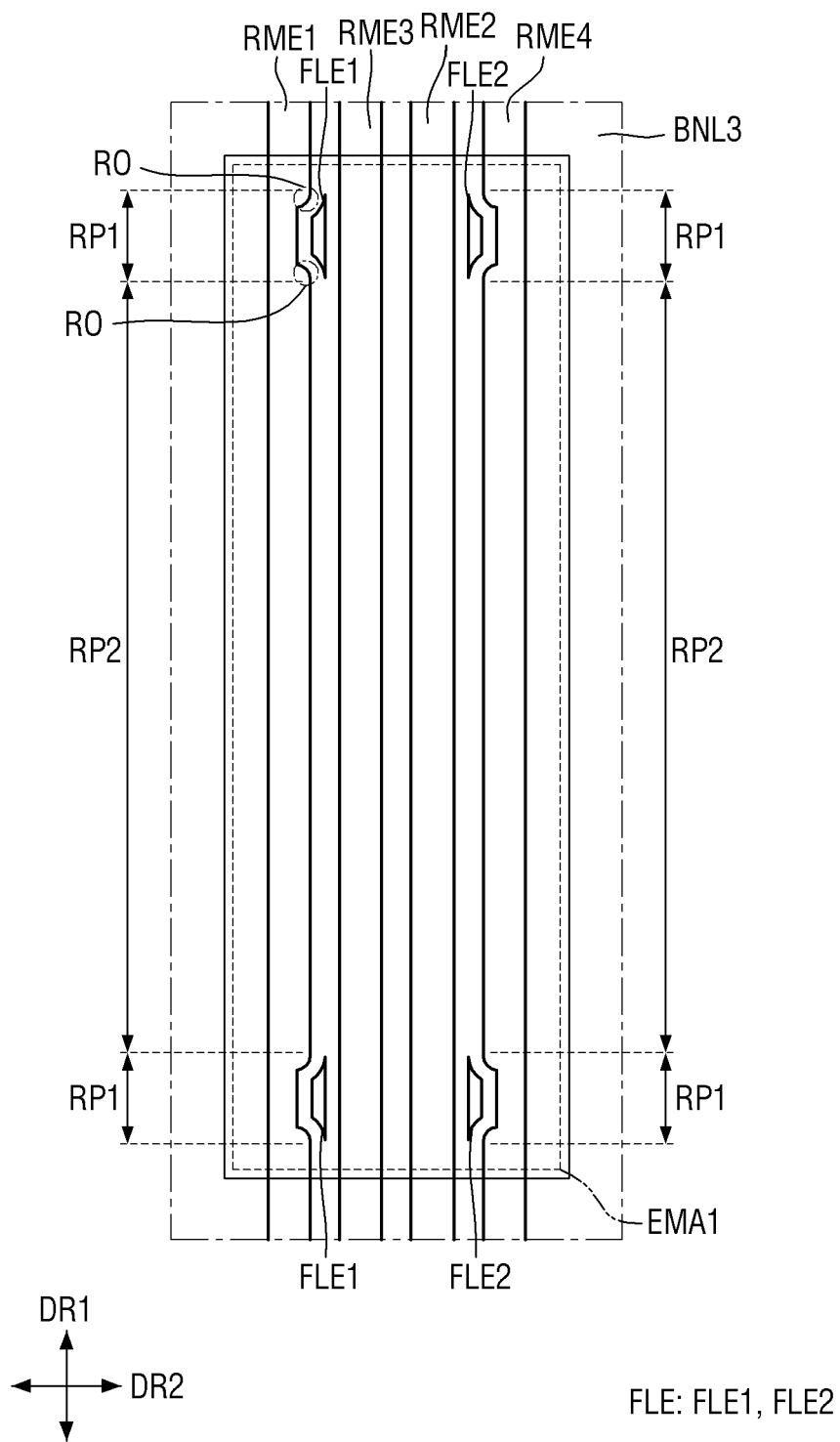
FIG. 9 is a schematic plan view schematically showing electrodes of a display device according to an embodiment.

FIG. 9 is a schematic plan view schematically showing electrodes of a display device according to an embodiment. The embodiment of FIG. 9 is different from the embodiments of FIGS. 7 and 8 in that the electrodes have different shapes. The embodiment of FIG. 9 is substantially identical to the embodiment of FIG. 3 except for the shapes of the electrodes; and, therefore, the redundant descriptions will be omitted.

Referring to FIG. 9 in conjunction with FIG. 3, the width of the first-type electrodes RME #1 may vary along the second direction DR2 and thus may be different depending on the positions. Each of the first electrode RME1 and the fourth electrode RME4 may include first portions RP1 having a narrow width and a second portion RP2 having a width greater than that of the first portions RP1. The inner side of the first portions RP1 of the first electrode RME1 that faces the third electrode RME3 may be inclined inward toward the outer side of the first portions RP1. The inner side of the first portions RP1 of the fourth electrode RME4 that faces the second electrode RME2 may be inclined inward toward the outer side of the first portions RP1.

The first electrode RME1 and the third electrode RME3 will be described as an example. The distance between the inner side of the first portions RP1 and the third electrode RME3 gradually increases along the first direction DR1 and gradually decreases from the point where the inclined surfaces meet each other. The inner side of the first electrode RME1 extended from the second portion RP2 is bent at the first portions RP1 to be recessed. The corners of the inner side of the first portions RP1 at which the inner side is bent may be rounded, for example, the inner side may include rounded corners RO. Likewise, the inner side of the fourth electrode RME4 extended from the second portion RP2 may be bent at the first portions RP1 to be recessed. The corners of the inner side of the first portions RP1 may be rounded, for example, the inner side may include rounded corners RO. The rounded corners RO of the inner side of the first portions RP1 can prevent that the electric field is concentrated and becomes strong between the first portions RP1 and the third electrode RME3 which may occur in case that the inner side has corners at the right angle.

According to an embodiment, the first-type electrodes RME #1 may include floating electrodes FLE adjacent to the first portions RP1 facing the second-type electrodes RME #2. The floating electrodes FLE may have a shape conforming to the shape of the recessed inner side of the first portions RP1 when viewed from the top. At least one side or a side of the floating electrodes FLE may include an inclined surface conforming to the shape of the rounded corners RO of the first portions RP1, so that the distance between the first portions RP1 and the floating electrodes FLE can be maintained.

Figure 10:
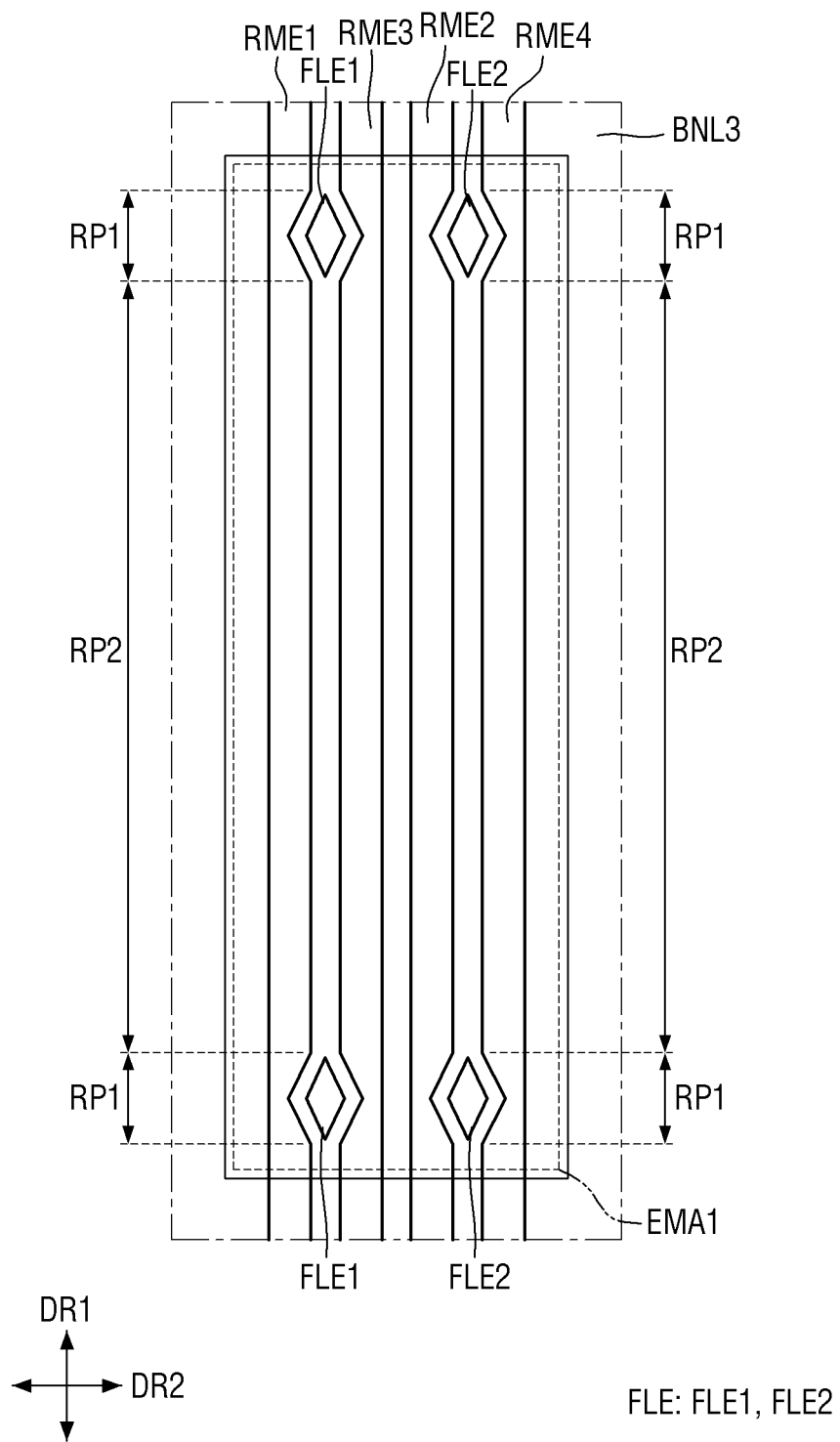
FIG. 10 is a schematic plan view schematically showing electrodes of a display device according to an embodiment.
Figure 11:
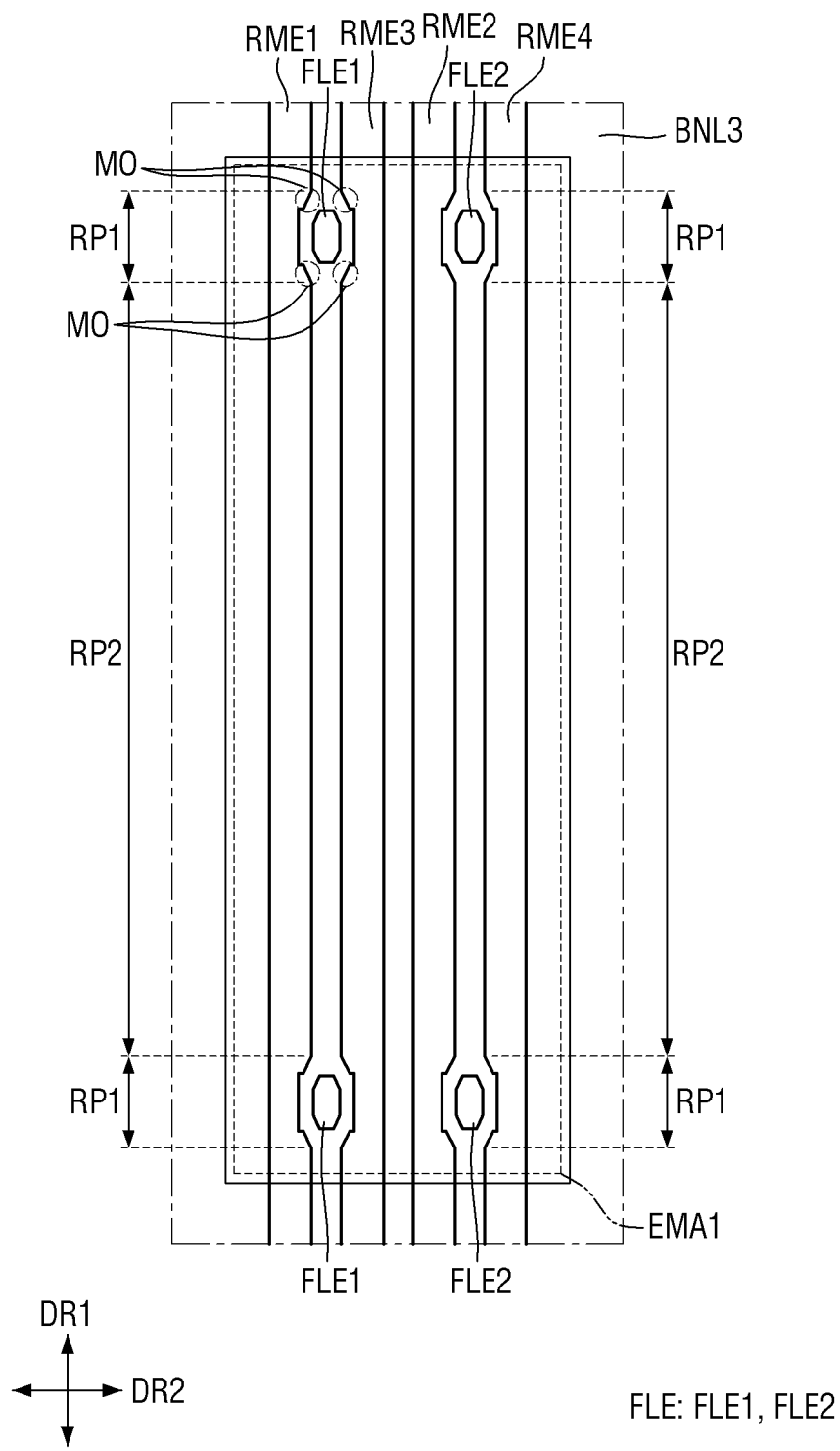
FIG. 11 is a schematic plan view schematically showing electrodes of a display device according to an embodiment.
Figure 12:
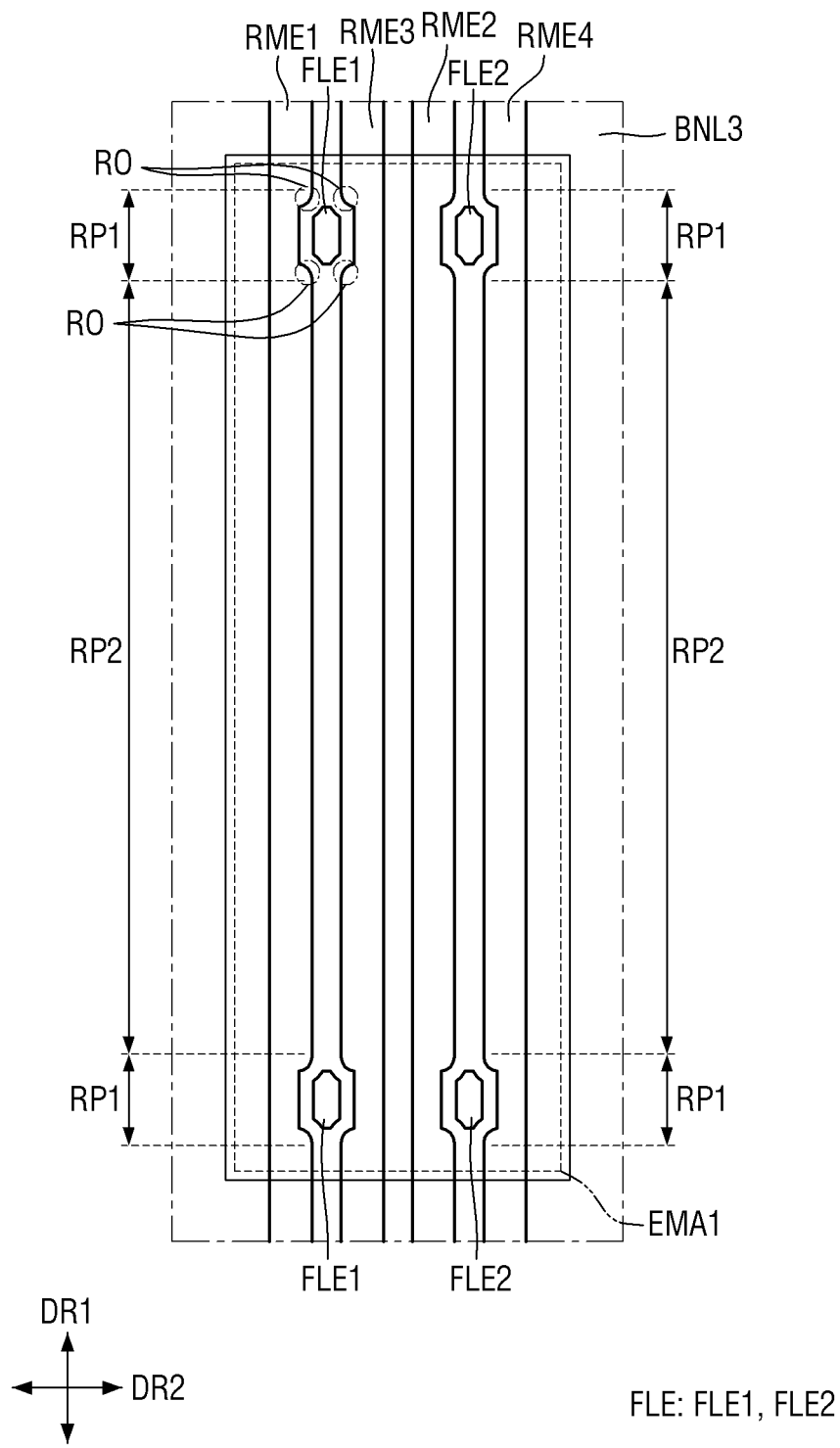
FIG. 12 is a schematic plan view schematically showing electrodes of a display device according to an embodiment.

FIG. 10 is a schematic plan view schematically showing electrodes of a display device according to an embodiment. FIG. 11 is a schematic plan view schematically showing electrodes of a display device according to an embodiment. FIG. 12 is a schematic plan view schematically showing electrodes of a display device according to an embodiment. Embodiments of FIGS. 10 to 12 may be different from embodiments of FIGS. 3 to 9 in that the electrodes have different shapes. Embodiments of FIGS. 10 to 12 may be substantially identical to the embodiment of FIG. 3 except for the shapes of the electrodes; and, therefore, the redundant descriptions will be omitted.

Referring to FIG. 10 in conjunction with FIG. 3, according to this embodiment, the electrodes RME may include electrodes RME having a symmetrical structure to guide the light-emitting diodes ED so that they are concentrated at a particular location.

The electrodes RME may have partially different widths. According to the embodiment, the electrodes RME may include portions having different widths measured in the second direction DR2 at different positions. According to an embodiment, the electrodes RME, for example, the first to fourth electrodes RME1 to RME4 may be the first-type electrodes RME #1.

For example, each of the first electrode RME1 to the fourth electrode RME4 may include a first portion RP1 having a narrow width and a second portion RP2 having a width greater than that of the first portion RP1. The first electrode RME1 and the fourth electrode RME4 may have a symmetrical structure, and the second electrode RME2 and the third electrode RME3 may also have a symmetrical structure. The first portions RP1 of the first to fourth electrodes RME1 to RME4 may be arranged or disposed parallel with one another in the second direction DR2. The widths of the first electrode RME1 to the fourth electrode RME4 may vary along the first direction DR1 as the first and second portions RP1 and RP2 may be alternately repeated.

The shape of the first-type electrodes RME #1 will be described with reference to the first electrode RME1 and the third electrode RME3 as an example. The first electrode RME1 and the third electrode RME3 include one or more first portions RP1 disposed in the emission area EMA, and the first portions RP1 may be spaced apart from one another in the first direction DR1, and the second portion RP2 may be disposed therebetween. In the example shown in FIG. 10, two first portions RP1 are disposed in the emission area EMA, and a second portion RP2 is disposed between them. The second portion RP2 may be located or disposed at the middle of the emission area EMA, and the first portions RP1 may be disposed on the upper and lower sides of the center of the emission area EMA, respectively. It is, however, to be understood that the disclosure is not limited thereto.

According to the embodiment, the inner side of the first electrode RME1 facing the third electrode RME3 and the inner side of the third electrode RME3 facing the first electrode RME1 may protrude or may be recessed in a certain direction, and thus the widths of the first electrode RME1 and the third electrode RME3 may vary. For example, the distance between the electrodes RME spaced apart from each other in the second direction DR2 may be generally constant, but the widths of the first electrodes RME1 and the third electrode RME3 may vary depending on the position.

The width of the first portions RP1 of the first electrode RME1 and the third electrode RME3 may be the minimum width of the first electrode RME1 and the third electrode RME3, while the width of the second portions RP2 may be the maximum width. The first electrode RME1 and the third electrode RME3 may have the same width except for the first portions RP1, for example, the width of the first portions RP1 may be smaller in the other portions.

According to the embodiment, the inner side of the first portions RP1 of the first electrode RME1 facing the third electrode RME3 may have an inclined shape, and may have a recessed shape substantially like a triangle when viewed from the top. The inner side of the first portions RP1 of the third electrode RME3 facing the first electrode RME1 may have an inclined shape, and may have a recessed shape substantially like a triangle when viewed from the top. The first portion RP1 of each of the first electrode RME1 and the third electrode RME3 may have the minimum width at the point where the inclined inner sides meet. The width of the first portion RP1 of each of the first electrode RME1 and the third electrode RME3 may gradually decrease and increase from the point where the inclined surfaces meet. It is, however, to be understood that the disclosure is not limited thereto.

Likewise, the second electrode RME2 and the fourth electrode RME4 include one or more first portions RP1 disposed in the emission area EMA, and the first portions RP1 are spaced apart from one another in the first direction DR1, and the second portion RP2 may be disposed therebetween. Since the second electrode RME2 may be substantially identical to the first electrode RME1 and the fourth electrode RME4 may be substantially identical to the third electrode RME3, the redundant description will be omitted.

The first electrode RME1 and the third electrode RME3 will be described as an example. According to the embodiment, the distance between the inner side of the first portions RP1 of the first electrode RME1 and the inner side of the first portions RP1 of the third electrode RME3 may gradually increase along the first direction DR1 and may gradually decrease from the point where the inclined surfaces meet each other. On the contrary, the distance between the inner side of the second portion RP2 of the first electrode RME1 and the inner side of the second portion RP2 of the third electrode RME3 is constant. Accordingly, in case that an electric field is generated between the first electrode RME1 and the third electrode RME3, the electric field is constant between the inner side of the second portion RP2 of the first electrode RME1 and the inner side of the second portion RP2 of the third electrode RME3, whereas the electric field becomes gradually weaker as the distance between the inner side of the first portions RP1 and the first portions RP1 of the third electrode RME3 increases and becomes stronger gradually therebetween. However, the maximum intensity of the electric field between the inner side of the first portions RP1 of the first electrode RME1 and the inner side of the first portions RP1 of the third electrode RME3 is smaller than the intensity of the electric field between the inner side of the second portion RP2 of the first electrode RME1 and the inner side of the second portion RP2 of the third electrode RME3.

In case that the ink containing the light-emitting diodes ED is disposed on the electrodes RME, the light-emitting diodes ED gather to a position where the electric field is stronger. For example, since the intensity of the electric field is greatest between the second portion RP2 of the first electrode RME1 and the second portion RP2 of the third electrode RME3, the light-emitting diodes ED may gather at the middle of the emission area EMA. The density of the light-emitting diodes ED is relatively low between the first portions RP1 of the first electrode RME1 and the first portions RP1 of the third electrode RME3 where the intensity of the electric field is relatively weak. In this manner, it is possible to prevent the light-emitting diodes ED from gathering at the edges of the emission area EMA, and to align them at the middle of the emission area EMA.

According to this embodiment, unlike embodiments of FIGS. 3 to 10 in which the first electrode RME1 and the fourth electrode RME4 include the first portions RP1 having reduced widths, the third electrode RME3 facing the first electrode RME1 and the second electrode RME2 facing the fourth electrode RME4 may also include the first portions RP1 having reduced widths. Accordingly, it is possible to further reduce the intensity of the electric field generated at the edges of the emission area EMA, thereby preventing the light-emitting diode ED from gathering at the edges of the emission area EMA and aligning the light-emitting diode ED at the middle of the emission area EMA.

According to an embodiment, the first to fourth electrodes RME1 to RME4 may include floating electrodes FLE adjacent to the first portions RP1 facing each other. A first floating electrode FLE1 may be disposed between the first portions RP1 of the first electrode RME1 and the first portions RP1 of the third electrode RME3, and the second floating electrode FLE2 may be disposed between the first portions RP1 of the fourth electrode RME4 and the first portions RP1 of the second electrodes RME2.

The floating electrodes FLE may have a shape conforming to the shape of the recessed inner sides of the first portions RP1 when viewed from the top. For example, as shown in FIG. 10, in case that the shape of the recessed inner side of the first portions RP1 of the first electrode RME1 is substantially a triangle, and the shape of the recessed inner side of the first portions RP1 of the third electrode RME3 is substantially a triangle when viewed from the top, the shape of the floating electrodes FLE may be formed in a substantially diamond shape when viewed from the top. It is, however, to be understood that the disclosure is not limited thereto.

Referring to an embodiment of FIG. 11, the distance between the inner side of the first portions RP1 of the first electrode RME1 and the inner side of the first portions RP1 of the third electrode RME3 may gradually increase along the first direction DR1 and may gradually decrease from the point where the inclined surfaces meet each other. The inner side of the first electrode RME1 extended from the second portion RP2 is bent at the first portions RP1 to be recessed. The inner side of the third electrode RME3 extended from the second portion RP2 is bent at the first portions RP1 to be recessed The corners of the inner side of the first portions RP1 of the first electrode RME1 and the inner side of the first portions RP1 of the third electrode RME3 at which the inner side is bent may be chamfered, for example, the inner side may include chamfered corners MO. Likewise, the inner side of the second electrode RME2 extended from the second portion RP2 and the inner side of the fourth electrode RME4 extended from the second portion RP2 may be bent at the first portions RP1 to be recessed. The corners of the inner side of the first portions RP1 of the second electrode RME2 and the inner side of the first portions RP1 of the fourth electrode RME4 at which the inner side is bent may be chamfered, for example, the inner side may include chamfered corners MO in a bent edge portion.

The chamfered corners MO of the inner side of the first portions RP1 of each of the first to fourth electrodes RME1 to RME4 can prevent that the electric field is concentrated and becomes strong between the first portions RP1 of the first electrode RME1 and the first portions RP1 of the third electrode RME3 and between the first portions RP1 of the second electrode RME2 and the first portions RP1 of the fourth electrode RME4, which may occur in case that the inner side has corners at the right angle.

According to an embodiment, the floating electrodes FLE may be included between the first portions RP1 of the first electrode RME1 and the first portions RP1 of the third electrode RME3 and between the first portions RP1 of the second electrode RME2 and the first portions RP1 of the fourth electrode RME4. The floating electrodes FLE may be formed in shapes conforming to the shape of the recessed inner side of the first portions RP1 of the first electrode RME1 and the shape of the recessed inner side of the first portions RP1 of the third electrode RME3 when viewed from the top. The floating electrodes FLE may be formed in shapes conforming to the shape of the recessed inner side of the first portions RP1 of the second electrode RME2 and the shape of the recessed inner side of the first portions RP1 of the fourth electrode RME4 when viewed from the top. For example, the floating electrodes FLE may be formed in an octagonal shape as shown in FIG. 11. It is, however, to be understood that the disclosure is not limited thereto. At least one side or a side of each of the floating electrodes FLE may include an inclined surface parallel to the chamfered corners MO of the first portions RP1, so that the distance between the first portions RP1 and the floating electrodes FLE can be maintained.

Referring to an embodiment of FIG. 12, the inner side of each of the first to fourth electrodes RME1 to RME4 extended from the second portion RP2 is bent and recessed at the first portions RP1. The corners of the inner side of the first portions RP1 of each of the first to fourth electrodes RME1 to RME4 may be rounded, for example, the inner side may include rounded corners RO. The rounded corners RO of the inner side of the first portions RP1 of each of the first to fourth electrodes RME1 to RME4 can prevent that the electric field is concentrated and becomes strong between the first portions RP1 of the first to fourth electrode RME1 to RME4, which may occur in case that the inner side has corners at the right angle.

According to an embodiment, the floating electrodes FLE may be included between the first portions RP1 of the first electrode RME1 and the first portions RP1 of the third electrode RME3 and between the first portions RP1 of the second electrode RME2 and the first portions RP1 of the fourth electrode RME4. The floating electrodes FLE may be formed in shapes conforming to the shape of the recessed inner side of the first portions RP1 of the first electrode RME1 and the shape of the recessed inner side of the first portions RP1 of the third electrode RME3 when viewed from the top. The floating electrodes FLE may be formed in shapes conforming to the shape of the recessed inner side of the first portion RP1 of the second electrode RME2 and the shape of the recessed inner side of the first portion RP1 of the fourth electrode RME4 when viewed from the top. At least one side or a side of the floating electrodes FLE may include inclined surfaces conforming to the shape of the rounded corners RO of the first portions RP1, so that the distance between the first portions RP1 and the floating electrodes FLE can be maintained.

Figure 13:
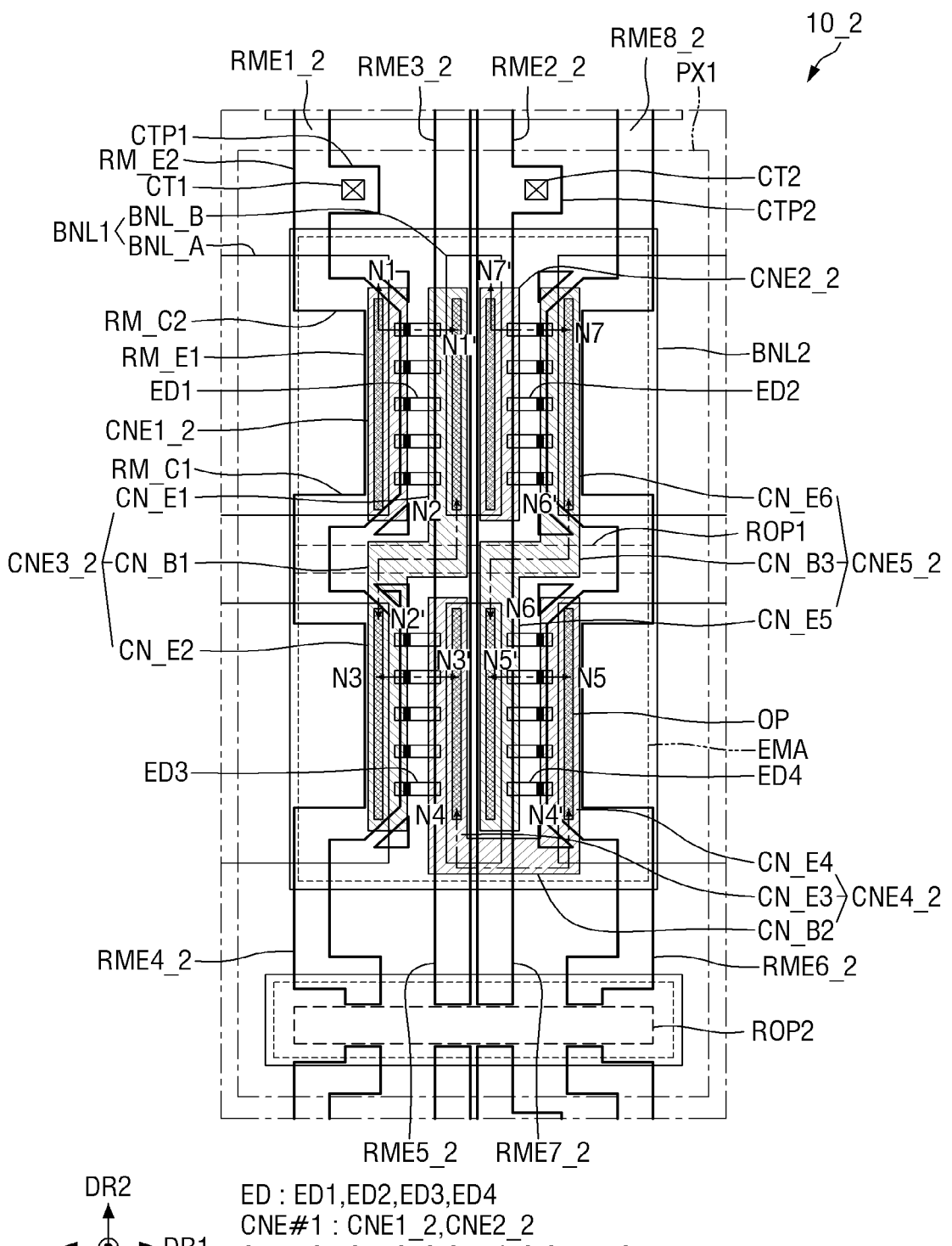
FIG. 13 is a schematic plan view showing a sub-pixel of a display device according to an embodiment.
Figure 14:
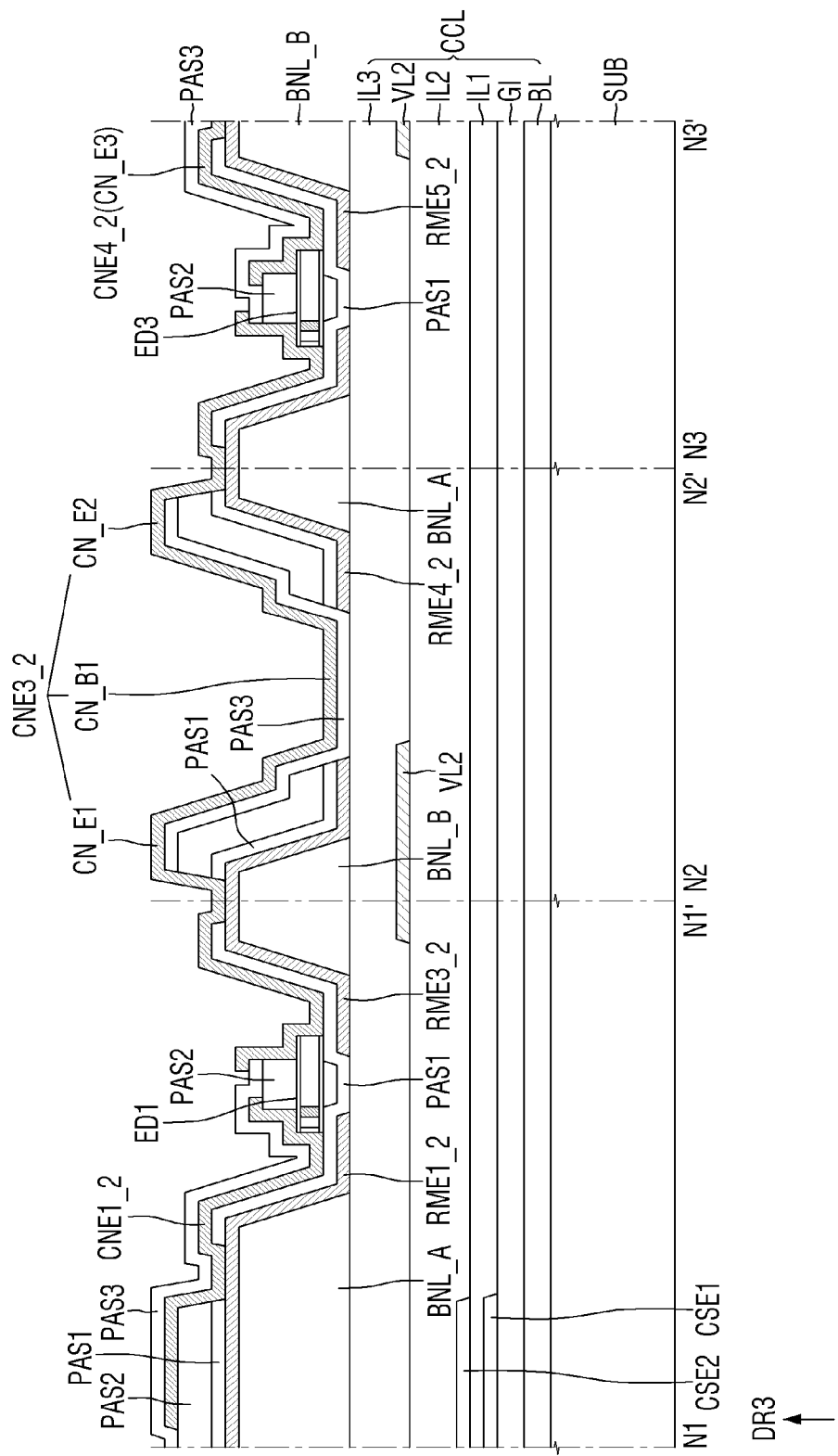
FIG. 14 is a schematic cross-sectional view taken along lines N1-N1', N2-N2' and N3-N3' of FIG. 13.
Figure 15:
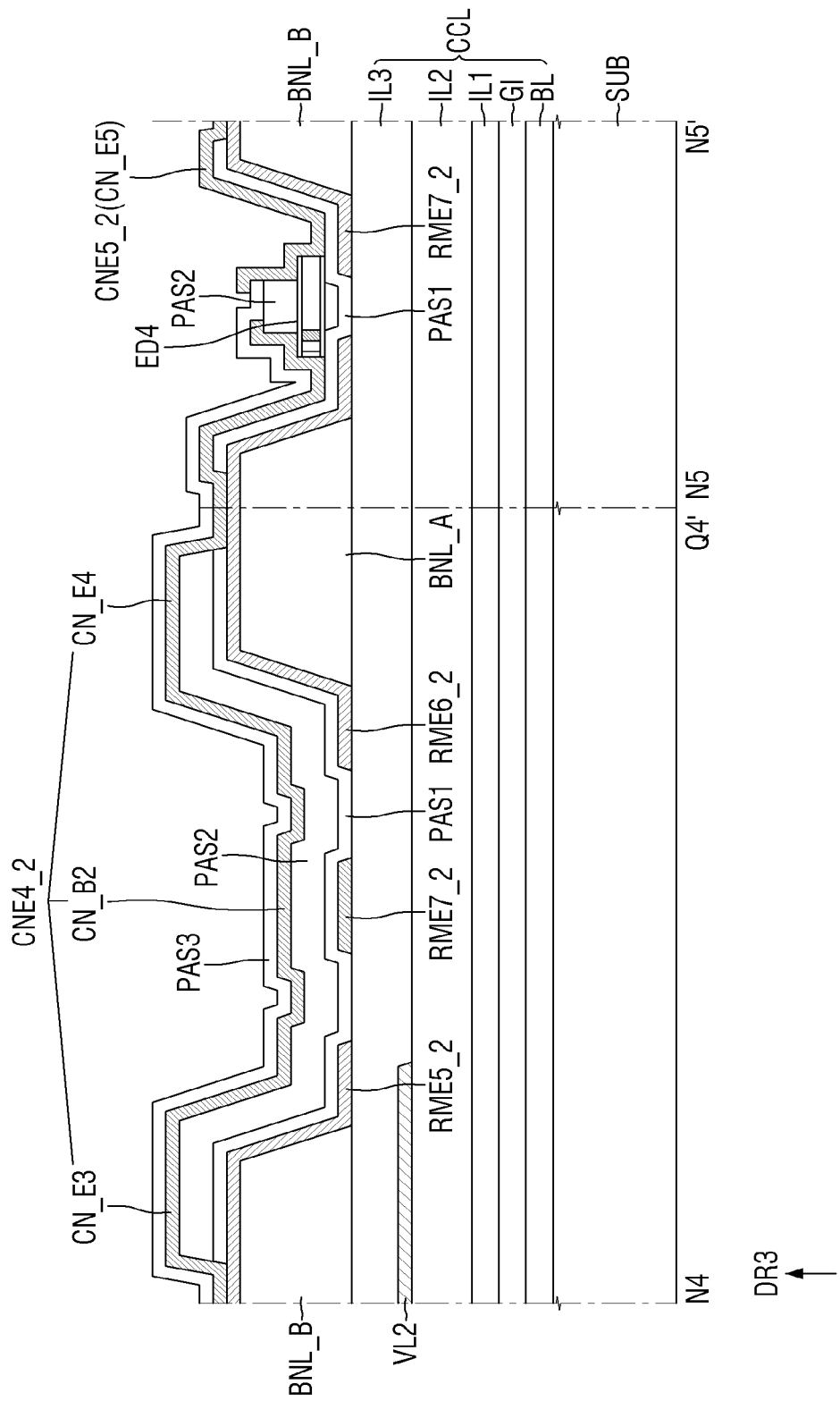
FIG. 15 is a schematic cross-sectional view taken along lines N4-N4' and N5-N5' of FIG. 13.
Figure 16:
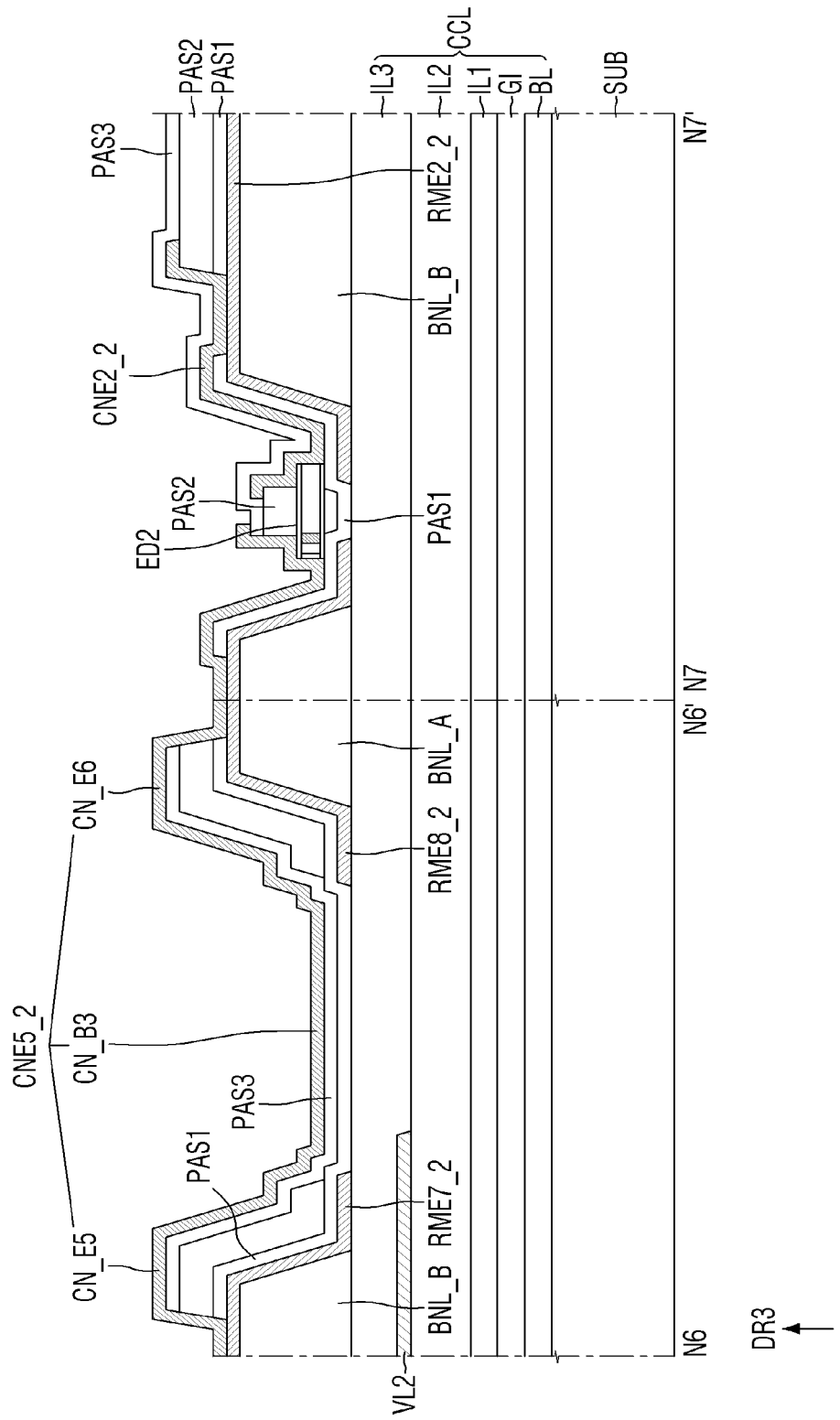
FIG. 16 is a schematic cross-sectional view taken along lines N6-N6' and N7-N7' of FIG. 13.

FIG. 13 is a schematic plan view showing a sub-pixel of a display device according to an embodiment. FIG. 14 is a schematic cross-sectional view taken along lines N1-N1', N2-N2' and N3-N3' of FIG. 13. FIG. 15 is a schematic cross-sectional view taken along lines N4-N4' and N5-N5' of FIG. 13. FIG. 16 is a schematic cross-sectional view taken along lines N6-N6' and N7-N7' of FIG. 13. FIG. 14 shows a schematic cross section of a first light-emitting diode ED1 and a third light-emitting diode ED3 and a schematic cross section taken along a third contact electrode CNE3_2. FIG. 15 shows a schematic cross section taken along a fourth contact electrode CNE4_2, and a schematic cross section passing through both ends of a fourth light-emitting diode ED4. FIG. 16 shows a schematic cross section taken along a fifth contact electrode CNE5_2, and a schematic cross section passing through both ends of a second light-emitting diode ED2.

Referring to FIGS. 13 to 16, a display device 10_2 may include a larger number of electrodes RME1_2, RME2_2, RME3_2, RME4_2, RME5_2, RME6_2, RME7_2 and RME8_2, light-emitting diodes ED1, ED2, ED3 and ED4, and contact electrodes CNE1_2, CNE2_2, CNE3_2, CNE4_2 and CNE5_2 for each of the sub-pixels PXn.

The electrodes may include the first electrode RME1_2, the fourth electrode RME4_2, the sixth electrode RME6_2 and the eighth electrode RME8_2 as four first-type electrodes RME #1, and the second electrode RME2_2, the third electrode RME3_2, the fifth electrode RME5_2 and the seventh electrode RME7_2 as four second-type electrodes RME #2. Similarly, the contact electrodes may include the first contact electrode CNE1_2 and the second contact electrode CNE2_2 as a pair of first-type contact electrodes CNE #1, and the third contact electrode CNE3_2, the fourth contact electrode CNE4_2 and the fifth contact electrode CNE5_2 as three second-type contact electrodes CNE #2. The light-emitting diodes ED may include first light-emitting diodes ED1 each having one end disposed on the first electrode RME1_2 and the other end disposed on the third electrode RME3_2, second light-emitting diodes ED2 each having one end disposed on the eighth electrode RME8_2 and the other end disposed on the second electrode RME2_2, third light-emitting diodes ED3 each having one end disposed on the fourth electrode RME4_2 and the other end disposed on the fifth electrode RME5_2, and fourth light-emitting diodes ED4 each having one end disposed on the sixth electrode RME6_2 and the other end disposed on the seventh electrode RME7_2.

The first bank BNL1 may include first sub-banks BNL_A disposed across adjacent sub-pixels PXn, and second sub-banks BNL_B disposed between the first sub-banks BNL_A. Second sub-banks BNL_B extended in the first direction DR1 and spaced apart from one another in the second direction DR2 are disposed at the center of the emission area EMA. The first sub-banks BNL_A may be disposed on both sides of each of the second sub-banks BNL_B in the second direction DR2, respectively.

According to an embodiment, the first electrode RME1_2, the fourth electrode RME4_2, the sixth electrode RME6_2 and the eighth electrode RME8_2 may have a partially bent shape. According to the embodiment, each of the first electrode RME1_2, the fourth electrode RME4_2, the sixth electrode RME6_2 and the eighth electrode RME8_2 may include extended electrode portions RM_E1 and RM_E2 extended in a direction, and bent electrode portions RM_C1 and RM_C2 bent in a different direction from them.

The first electrode RME1_2 will be described as an example. The first electrode RME1_2 may include a first extended electrode portion RM_E1 and a second extended electrode portion RM_E2 extended in the first direction DR1, and a first bent electrode portion RM_C1 and a second bent electrode portion RM_C2 electrically connected to at least one of the extended electrode portions RM_E1 and RM_E2. The first extended electrode portion RM_E1 may be disposed on the first bank BNL1 in the emission area EMA, and the second extended electrode portion RM_E2 may be disposed in an area other than the emission area EMA such that it overlaps with the second bank BNL2. The first bent electrode portion RM_C1 may be electrically connected to one side or a side of the first extended electrode portion RM_E1 and may be spaced apart from the first bent electrode portion RM_C1 of the fourth electrode RME4_2 spaced apart in the first direction DR1. The second bent electrode portion RM_C2 is disposed between the first extended electrode portion RM_E1 and the second extended electrode portion RM_E2 to electrically connect between them. The first bent electrode portion RM_C1 and the second bent electrode portion RM_C2 may have a shape that is bent in a direction between the first direction DR1 and the second direction DR2 and extended toward the outer side from the center of the emission area EMA.

The eighth electrode RME8_2 may be spaced apart from the first electrode RME1_2 in the second direction DR2. The eighth electrode RME8_2 may be symmetrical to the first electrode RME1_2 with respect to an imaginary line passing through the center of the emission area EMA in the first direction DR1. The fourth electrode RME4_2 is spaced apart from the first electrode RME1_2 in the first direction DR1. The fourth electrode RME4_2 may be symmetrical to the first electrode RME1_2 with respect to an imaginary line passing through the center of the emission area EMA in the second direction DR2. Similarly, the sixth electrode RME6_2 may be symmetrical to the eighth electrode RME8_2.

On the other hand, the second electrode RME2_2, the third electrode RME3_2, the fifth electrode RME5_2 and the seventh electrode RME7_2 may have a shape extended in the first direction DR1 without a bent portion.

The first electrode RME1_2 may be disposed on the upper left side with respect to the center of the emission area EMA. A portion of the first electrode RME1_2 may be disposed on the first sub-bank BNL_A disposed on the upper side among the first sub-banks BNL_A disposed across an adjacent sub-pixel PXn in the second direction DR2. The second electrode RME2_2 may be disposed on the opposite side of the second sub-bank BNL_B in the second direction DR2 disposed on the upper side among the second sub-banks BNL_B.

The third electrode RME3_2 may be disposed between the first electrode RME1_2 and the second electrode RME2_2, and may be disposed on one side or a side of the second sub-bank BNL_B in the second direction DR2 on which the second electrode RME2_2 is disposed. The third electrode RME3_2 may be spaced apart from the first extended electrode portions RM_E1 and RM_E2 of the first electrode RME1_2 and the second electrode RME2_2, and the first light-emitting diodes ED1 may be disposed between the third electrode RME3_2 and the first electrode RME1_2. The fourth electrode RME4_2 may be symmetrical to the first electrode RME1_2 in the first direction DR1. The fourth electrode RME4_2 may be disposed on the first sub-bank BNL_A disposed on the lower left side of the emission area EMA among the first sub-banks BNL_A.

The fifth electrode RME5_2 may be spaced apart from the third electrode RME3_2 in the first direction DR1 and may be spaced apart from the fourth electrode RME4_2 in the second direction DR2. The fifth electrode RME5_2 may be disposed on one side or a side of the second sub-bank BNL_B in the second direction DR2 disposed on the lower side among the second sub-banks BNL_B. The third light-emitting diodes ED3 may be disposed in the area between the fourth electrode RME4_2 and the fifth electrode RME5_2 spaced apart from each other. The sixth electrode RME6_2 may be symmetrical to the fourth electrode RME4_2 in the second direction DR2, and may be disposed on the first sub-bank BNL_A disposed on the lower right side with respect to the center of the emission area EMA.

The seventh electrode RME7_2 may be disposed between the fifth electrode RME5_2 and the sixth electrode RME6_2, and may be disposed on the opposite side of the second sub-bank BNL_B in the second direction DR2 on which the fifth electrode RME5_2 is disposed. The seventh electrode RME7_2 may be spaced apart from the first extended electrode portions RM_E1 and RM_E2 of the sixth electrode RME6_2 and the fifth electrode RME5_2, and the fourth light-emitting diodes ED4 may be disposed between the seventh electrode RME7_2 and the sixth electrode RME6_2. The eighth electrode RME8_2 may be symmetrical to the sixth electrode RME6_2 in the first direction DR1. The eighth electrode RME8_2 may be disposed on the first sub-bank BNL_A disposed on the upper right side of the emission area EMA among the first sub-banks BNL_A. The eighth electrode RME8_2 may be spaced apart from the second electrode RME2_2, and second light-emitting diodes ED2 may be disposed thereon.

With respect to the center of the emission area EMA, the first electrode RME1_2, the third electrode RME3_2, the second electrode RME2_2 and the eighth electrode RME8_2 disposed on the upper side may be spaced apart from the fourth electrode RME4_2, the fifth electrode RME5_2, the seventh electrode RME7_2 and the sixth electrode RME6_2 disposed on the lower side in the first direction DR1, respectively. The areas between the electrodes spaced apart from each other in the second direction DR2 may be the areas where the electrode lines are separated from each other at electrode separation regions ROP1 and ROP2.

The electrodes disposed on the same second sub-bank BNL_B are spaced apart from each other in the second direction DR2 on the second sub-bank BNL_B, and the light-emitting diodes ED are not disposed in the area therebetween. On the other hand, the light-emitting diodes ED may be disposed in the area between the electrodes disposed on the first sub-bank BNL_A and the second sub-bank BNL_B, respectively. The electrodes disposed on the first sub-bank BNL_A include bent electrode portions RM_C1 and RM_C2, and the distance from the electrodes disposed on the second sub-bank BNL_B may vary depending on positions. Accordingly, most of the light-emitting diodes ED may be disposed in the area between the first sub-bank BNL_A and the second sub-bank BNL_B.

In the first electrode RME1_2 and the second electrode RME2_2, electrode contacts CTP1 and CTP2 may be formed such that they overlap with the second bank BNL2, and they may be electrically connected or directly connected to the second conductive layer through the contacts CT1 and CT2. On the other hand, the third to eighth electrodes RME3_2 to RME8_2 other them may not be electrically connected or directly connected to the second conductive layer.

The first contact electrode CNE1_2 and the second contact electrode CNE2_2 may be disposed on the first electrode RME1_1 and the second electrode RME2_1, respectively. The first contact electrode CNE1_2 may be disposed on the first extended electrode portion RM_E1 of the first electrode RME1_2 and may be in contact with first ends of the first light-emitting diodes ED1 and the first electrode RME1_2. The second contact electrode CNE2_2 may be disposed on the second electrode RME2_2 and may be in contact with second ends of the second light-emitting diodes ED2 and the second electrode RME2_2.

The third contact electrode CNE3_2, the fourth contact electrode CNE4_2 and the fifth contact electrode CNE5_2 may include contact electrode extensions CN_E1, CN_E2, CN_E3, CN_E4, CN_E5 and CN_E6, and contact electrode bridges CN_B1, CN_B2 and CN_B3.

For example, the first contact electrode extension CN_E1 of the third contact electrode CNE3_2 may be disposed on the third electrode RME3_2, and the second contact electrode extension CN_E2 thereof may be disposed on the fourth electrode RME4_2. The first contact electrode bridge CN_B1 may be disposed in the area between the first electrode RME1_2 and the fourth electrode RME4_2 spaced apart from each other in the first direction DR1. The third contact electrode CNE3_2 may be in contact with the second ends of the first light-emitting diodes ED1 and the first ends of the third light-emitting diodes ED3, and at the same time, may be in contact with the third electrode RME3_2 and the fourth electrode RME4_2. The third contact electrode extension CN_E3 of the fourth contact electrode CNE4_2 may be disposed on the fifth electrode RME5_2, and the fourth contact electrode extension CN_E4 thereof may be disposed on the sixth electrode RME6_2. The second contact electrode bridge CN_B2 may be disposed in the area between the third contact electrode extension CN_E3 and the second bank BNL2 and between the fourth contact electrode extension CN_E4 and the second bank BNL2. The fourth contact electrode CNE4_2 may be in contact with the second ends of the third light-emitting diodes ED3 and the first ends of the fourth light-emitting diodes ED4, and at the same time, may be in contact with the fifth electrode RME5_2 and the sixth electrode RME6_2. The fifth contact electrode extension CN_E5 of the fifth contact electrode CNE5_2 may be disposed on the seventh electrode RME7_2, and the sixth contact electrode extension CN_E6 thereof may be disposed on the eighth electrode RME8_2. The third contact electrode bridge CN_B3 may be disposed in the area between the eighth electrode RME8_2 and the sixth electrode RME6_2 spaced apart from each other in the second direction DR2. The fifth contact electrode CNE5_2 may be in contact with the second ends of the fourth light-emitting diodes ED4 and the first ends of the second light-emitting diodes ED2, and at the same time, may be in contact with the seventh electrode RME7_2 and the eighth electrode RME8_2. Unlike the first contact electrode bridge CN_B1 and the third contact electrode bridge CN_B3, the second contact electrode bridge CN_B2 is disposed between the seventh electrode RME7_2 and the second bank BNL2. According to an embodiment, the second contact electrode bridge CN_B2 may be disposed on one side or a side of the seventh electrode RME7_2 in the second direction DR2, and the third contact electrode bridge CN_B3 may be disposed on the opposite side of the seventh electrode RME7_2 in the second direction DR2.

The first ends of the first light-emitting diodes ED1 and the second ends of the second light-emitting diodes ED2 may be electrically connected to the first electrode RME1_2 and the second electrode RME2_2 through the first-type contact electrodes CNE #1, and an electric signal applied from the second conductive layer may be transmitted. The electric signal may flow through the second-type contact electrodes CNE #2, the third light-emitting diodes ED3 and the fourth light-emitting diodes ED4, and the first to fourth light-emitting diodes ED1, ED2, ED3 and ED4 may be electrically connected in series with one another.

Figure 17:
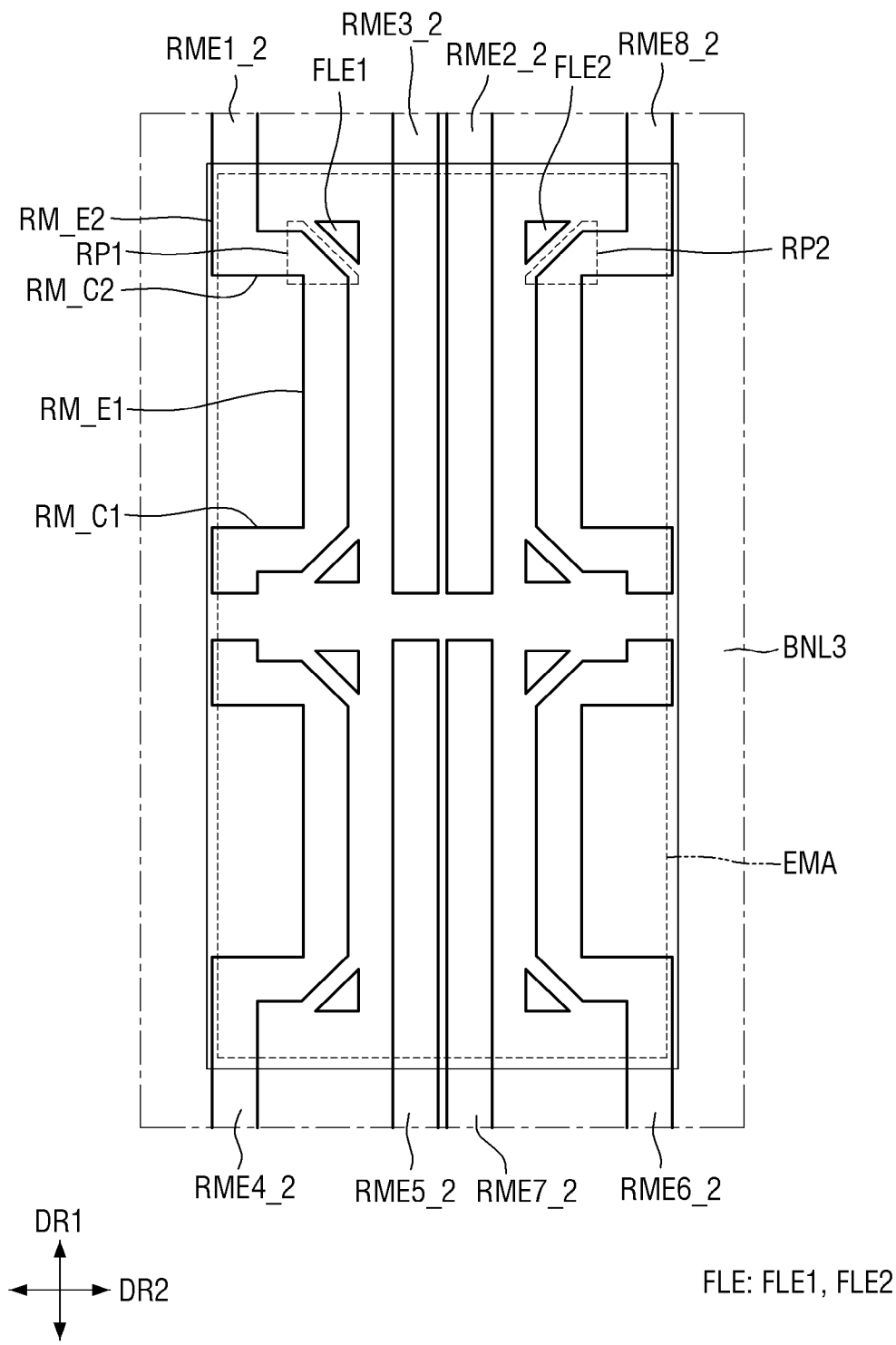
FIG. 17 is a schematic plan view schematically showing electrodes of a display device according to an embodiment.

FIG. 17 is a schematic plan view schematically showing electrodes of a display device according to an embodiment.

Referring to FIG. 17, a first electrode RME1_2, a fourth electrode RME4_2, a sixth electrode RME6_2 and an eighth electrode RME8_2 may have a partially bent shape. According to the embodiment, each of the first electrode RME1_2, the fourth electrode RME4_2, the sixth electrode RME6_2 and the eighth electrode RME8_2 may include extended electrode portions RM_E1 and RM_E2 extended in a direction, and bent electrode portions RM_C1 and RM_C2 bent in a different direction from them.

According to the embodiment, first-type electrodes RME #1 may include portions having different widths in the first direction DR1 and in the second direction DR2 between extended electrode portions RM_E1 and RM_E2 and the bent electrode portions RM_C1 and RM_C2. The electrodes RME may further include second-type electrodes RME #2 that are spaced apart from the first-type electrodes RME #1 and face them and having a constant width measured in the second direction DR2 along the direction in which they are extended. The first-type electrodes RME #1 and the second-type electrodes RME #2 face each other while being spaced apart in the second direction DR2, but they may have an asymmetric structure.

For example, the first-type electrodes RME #1 may include the first electrode RME1_2, the fourth electrode RME4_2, the sixth electrode RME6_2 and the eighth electrode RME8_2, and the first electrode RME1_2, the fourth electrode RME4_2, the sixth electrode RME6_2 and the eighth electrode RME8_2 may include first portions RP1 having a narrow width. The first electrode RME1_2, the fourth electrode RME4_2, the sixth electrode RME6_2 and the eighth electrode RME8_2 may have the same width and may be extended generally in the first direction DR1, but the width may become narrower at the first portions RP1. At the first portions RP1, where the bent electrode portions RM_C1 and RM_C2 and the extended electrode portions RM_E1 may meet each other. The second-type electrodes RME #2 include a second electrode RME2_2, a third electrode RME3_2, a fifth electrode RME5_2 and a seventh electrode RME7_2, which may have the same width and may be extended in the first direction DR1.

The first electrode RME1_2, the fourth electrode RME4_2, the sixth electrode RME6_2 and the eighth electrode RME8_2, which are the first-type electrodes RME #1, have first portions RP1, the bent electrode portions RM_C1 and RM_C2 and the extended electrode portions RM_E1 and RM_E2 alternately repeated, and the width may vary along the first direction DR1. For example, while the second-type electrodes RME #2 have a uniform width, the first-type electrodes RME #1 facing them, respectively, have varying widths, and thus they may be asymmetrical to each other.

The shape of the first-type electrodes RME #1 will be described with reference to the first electrode RME1_2 as an example. The first electrode RME1_2 may include one or more first portions RP1 disposed in the emission area EMA. The first portions RP1 may be spaced apart from one another in the first direction DR1 and the extended electrode portion RM_E1 may be disposed therebetween. In the example shown in FIG. 17, two first portions RP1 are disposed in the emission area EMA, and the extended electrode portion RM_E1 is disposed between them.

According to an embodiment, the inner side of the both sides of the first-type electrodes RME #1 facing the second-type electrodes RME #2 has a shape protruding or bent in a certain direction, and thus the width of the first-type electrodes RME #1 may vary. For example, the distance between the electrodes RME spaced apart from each other in the second direction DR2 may be generally constant, but the width of the first electrodes RME1 may vary depending on the position.

According to the embodiment, the inner side of the first portions RP1 of the first-type electrodes RME #1 facing the second-type electrodes RME #2 may have an inclined shape, and may have a chamfered corner when viewed from the top. The first electrode RME1_2, the fourth electrode RME4_2, the sixth electrode RME6_2 and the eighth electrode RME8_2, which are the first-type electrodes RME #1, may have the minimum width at the inclined inner side of the first portions RP1. For example, each of the first electrode RME1_2, the fourth electrode RME4_2, the sixth electrode RME6_2 and the eighth electrode RME8_2, which are the first-type electrodes RME #1, may have a shape in which the width decreases at the inclined inner side adjacent to the extended electrode portion RM_E1 and increases at the bent electrode portions RM_C1 and RM_C2. It is, however, to be understood that the disclosure is not limited thereto.

According to an embodiment, it is possible to prevent that the light-emitting diodes ED gather together at the edges of the emission area EMA by way of reducing the intensity of the electric field of the electrodes RME at the edges of the emission area EMA.

The first electrode RME1_2 and the third electrode RME3_2 will be described as an example. The distance is constant between the extended electrode portion RM_E1 and the third electrode RME3_2 and increases between the inner side of the first portions RP1 and the third electrode RME3_2 at the first portions RP1. Accordingly, in case that an electric field is generated between the first electrode RME1_2 and the third electrode RME3_2, the electric field is constant between the inner side of the extended electrode portion RM_E1 of the first electrode RME1_2 and the third electrode RME3_2, whereas the electric field becomes gradually weaker as the distance between the inner side of the first portions RP1 and the third electrode RME3_2 increases. The maximum intensity of the electric field between the inner side of the first portion RP1 and the third electrode RME3_2 is less than the intensity of the electric field between the inner side of the extended electrode portion RM_E1 and the third electrode RME3_2.

In case that the ink containing the light-emitting diodes ED is disposed on the electrodes RME, the light-emitting diodes ED gather to a position where the electric field is stronger. For example, since the intensity of the electric field is greatest between the extended electrode portion RM_E1 and the third electrode RME3_2, the light-emitting diodes ED may gather at the middle of the emission area EMA. The density of the light-emitting diodes ED is relatively low between the first portions RP1 of the first electrode RME1_2 and the third electrode RME3_2 where the intensity of the electric field is relatively weak. In this manner, it is possible to prevent the light-emitting diodes ED from gathering at the edges of the emission area EMA, and to align them at the middle of the emission area EMA.

According to an embodiment, the first-type electrodes RME #1 may include floating electrodes FLE adjacent to the first portions RP1 facing the second-type electrodes RME #2. First floating electrodes FLE1 may be disposed between the first portions RP1 of the first electrode RME1_2 and the third electrode RME3_2, and first floating electrodes FLE1 may be disposed between the first portions RP1 of the fourth electrode RME4_2 and the fifth electrodes RME5_2. Second floating electrodes FLE2 may be disposed between the first portions RP1 of the eighth electrode RME8_2 and the second electrode RME2_2, and second floating electrodes FLE2 may be disposed between the first portions RP1 of the sixth electrode RME6_2 and the seventh electrodes RME7_2.

No electric signal is applied to the floating electrodes FLE and thus they may be in a floating state. The floating electrodes FLE may be arranged or disposed in an island or isolated pattern. The floating electrodes FLE may be made of the same material or similar material as the electrodes RME and may be formed together with them. In case that an electric field is generated between the first portion RP1 of the first electrode RME1_2 and the third electrode RME3_2, between the first portion RP1 of the fourth electrode RME4_2 and the fifth electrode RME5_2, between the first portion RP1 of the eighth electrode RME8_2 and the second electrode RME2_2, and between the first portion RP1 of the sixth electrode RME6_2 and the seventh electrode RME7_2, the floating electrodes FLE can shield the electric field to reduce the strength of the electric field.

The floating electrodes FLE may have a shape conforming to the shape of the recessed inner side of the first portions RP1 when viewed from the top. For example, in case that a corner of the inner side of the first portions RP1 is chamfered as shown in FIG. 17, the shape of the floating electrodes FLE may be formed in a triangle when viewed from the top, conforming to the chamfered corner. It is, however, to be understood that the disclosure is not limited thereto.

Figure 18:
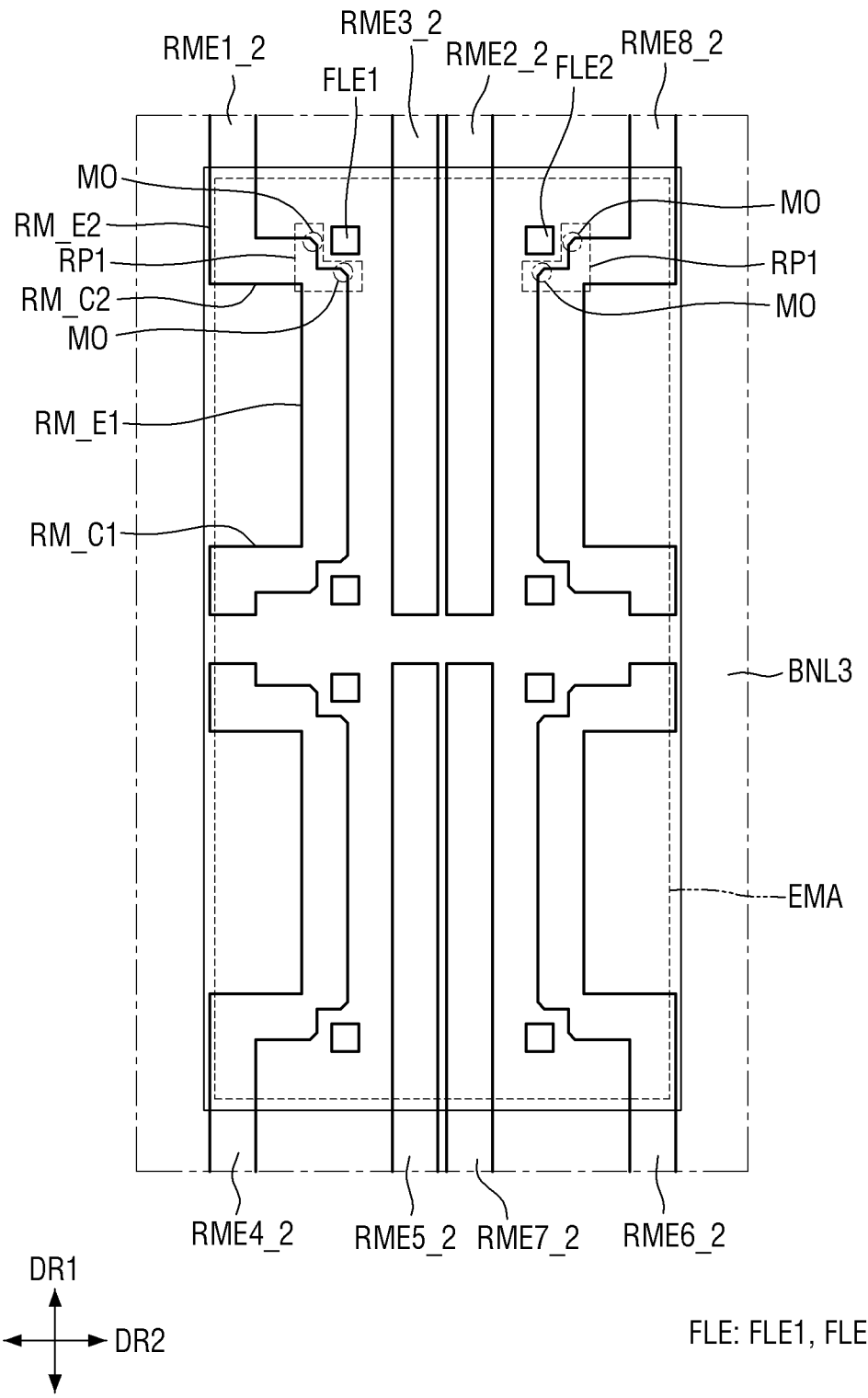
FIG. 18 is a schematic plan view schematically showing electrodes of a display device according to an embodiment.

FIG. 18 is a schematic plan view schematically showing electrodes of a display device according to an embodiment. The embodiment of FIG. 18 is different from the embodiment of FIG. 7 in that the electrodes have different shapes. The embodiment of FIG. 18 is substantially identical to the embodiment of FIG. 13 except for the shapes of the electrodes; and, therefore, the redundant descriptions will be omitted.

Referring to FIG. 18 in conjunction with FIG. 13, each of the first electrode RME1_2, the fourth electrode RME4_2, the sixth electrode RME6_2 and the eighth electrode RME8_2, which are the first-type electrodes RME #1, may include extended electrode portions RM_E1 and RM_E2, bent electrode portions RM_C1 and RM_C2, and first portions RP1 where they meet each other. The inner side of the first portions RP1 of each of the first electrode RME1_2, the fourth electrode RME4_2, the sixth electrode RME6_2 and the eighth electrode RME8_2 that faces the second-type electrodes RME #2 may be recessed like stairs toward the outer side of the first portions RP1 and the corners may be rounded.

The first electrode RME1_2 and the third electrode RME3_2 will be described as an example. The inner side extended from the extended electrode portion RM_E1 of the first electrode RME1_2 may be bent and recessed at the first portion RP1. The corners of the inner side of the first portions RP1 at which the inner side is bent may be chamfered, for example, the inner side may include chamfered corners MO. Likewise, the corners of the first portions RP1 of the fourth electrode RME4_2, the first portions RP1 of the sixth electrode RME6_2 and the first portions RP1 of the eighth electrode RME8_2 may also be chamfered, for example, the chamfered corners MO may be formed. The chamfered corners MO of the inner side of the first portions RP1 can prevent that the electric field is concentrated and becomes strong between the first portions RP1 and the third electrode RME3_2 which may occur in case that the inner side has corners at the right angle.

According to an embodiment, the first-type electrodes RME #1 may include floating electrodes FLE adjacent to the first portions RP1 facing the second-type electrodes RME #2. The floating electrodes FLE may be formed in a shape conforming to the shape of the recess inner side of the first portions RP1, so that the distance between the first portions RP1 and the floating electrodes FLE can be maintained. Although the floating electrode FLE has a substantially square shape in the example shown in FIG. 18, they may be formed in a substantially polygonal shape or a substantially circular shape in addition to the substantially square shape. Although each of the floating electrodes FLE is formed as a single piece, each of the floating electrodes FLE may be divided into parts.

Figure 19:
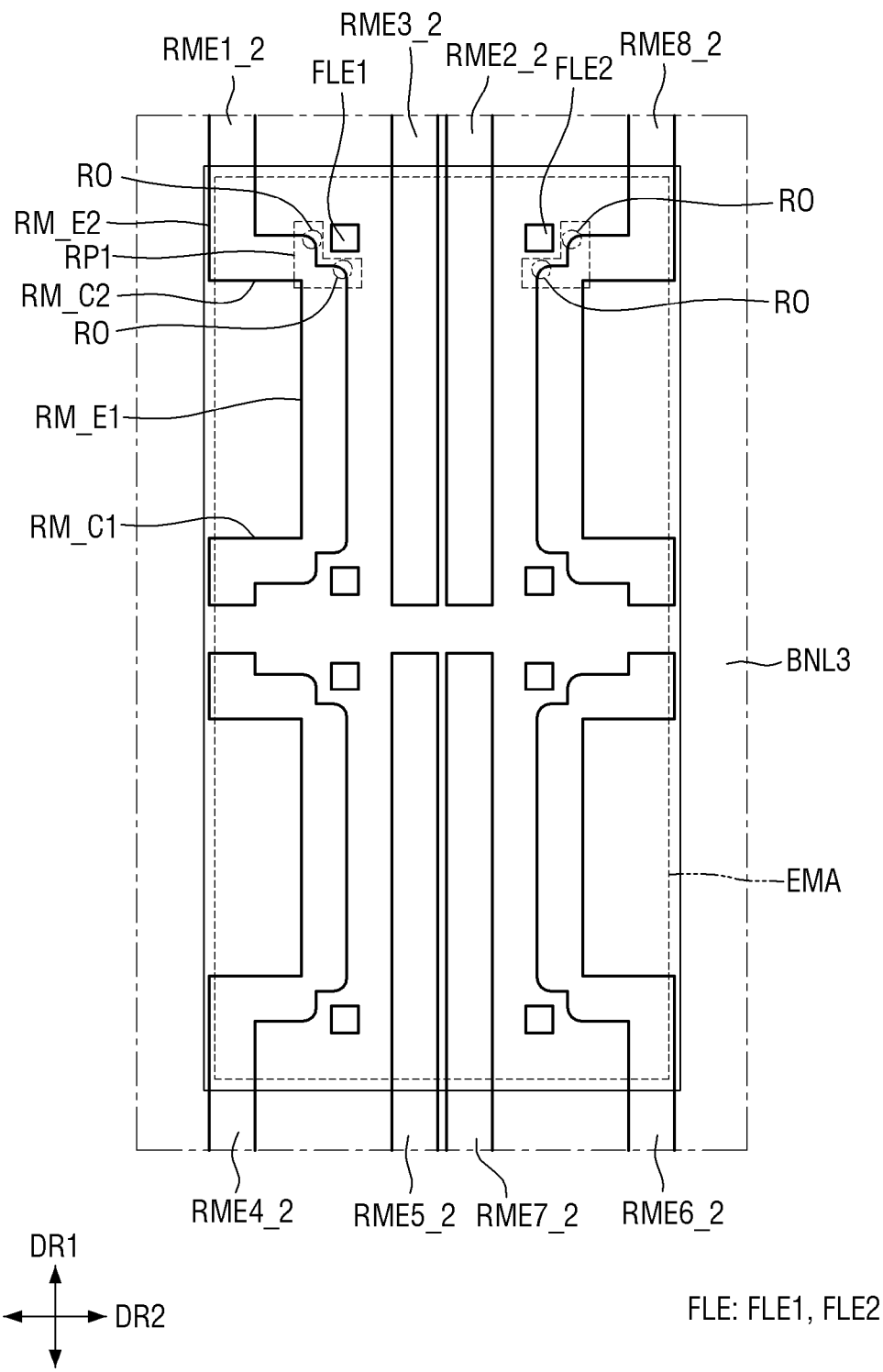
FIG. 19 is a schematic plan view schematically showing electrodes of a display device according to an embodiment.

FIG. 19 is a schematic plan view schematically showing electrodes of a display device according to an embodiment. The embodiment of FIG. 19 may be different from the embodiments of FIGS. 17 and 8 in that the electrodes have different shapes. The embodiment of FIG. 19 may be substantially identical to an embodiment of FIG. 13 except for the shapes of the electrodes; and, therefore, the redundant descriptions will be omitted.

Referring to FIG. 19 in conjunction with FIG. 13, each of the first electrode RME1_2, the fourth electrode RME4_2, the sixth electrode RME6_2 and the eighth electrode RME8_2, which are the first-type electrodes RME #1, may include extended electrode portions RM_E1 and RM_E2, bent electrode portions RM_C1 and RM_C2, and first portions RP1 where they meet each other. The inner side of the first portions RP1 of each of the first electrode RME1_2, the fourth electrode RME4_2, the sixth electrode RME6_2 and the eighth electrode RME8_2 that faces the second-type electrodes RME #2 may be recessed like stairs toward the outer side of the first portions RP1 and the corners may be rounded.

The first electrode RME1_2 and the third electrode RME3_2 will be described as an example. The inner side of the first portions RP1 of the first electrode RME1_2 may include rounded corners RO. Likewise, the inner side of the first portions RP1 of the fourth electrode RME4_2, the first portions RP1 of the sixth electrode RME6_2 and the first portions RP1 of the eighth electrode RME8_2 may also include rounded corners RO. The rounded corners RO of the inner side of the first portions RP1 can prevent that the electric field is concentrated and becomes strong between the first portions RP1 and the third electrode RME3_2 which may occur in case that the inner side has corners at the right angle.

Figure 20:
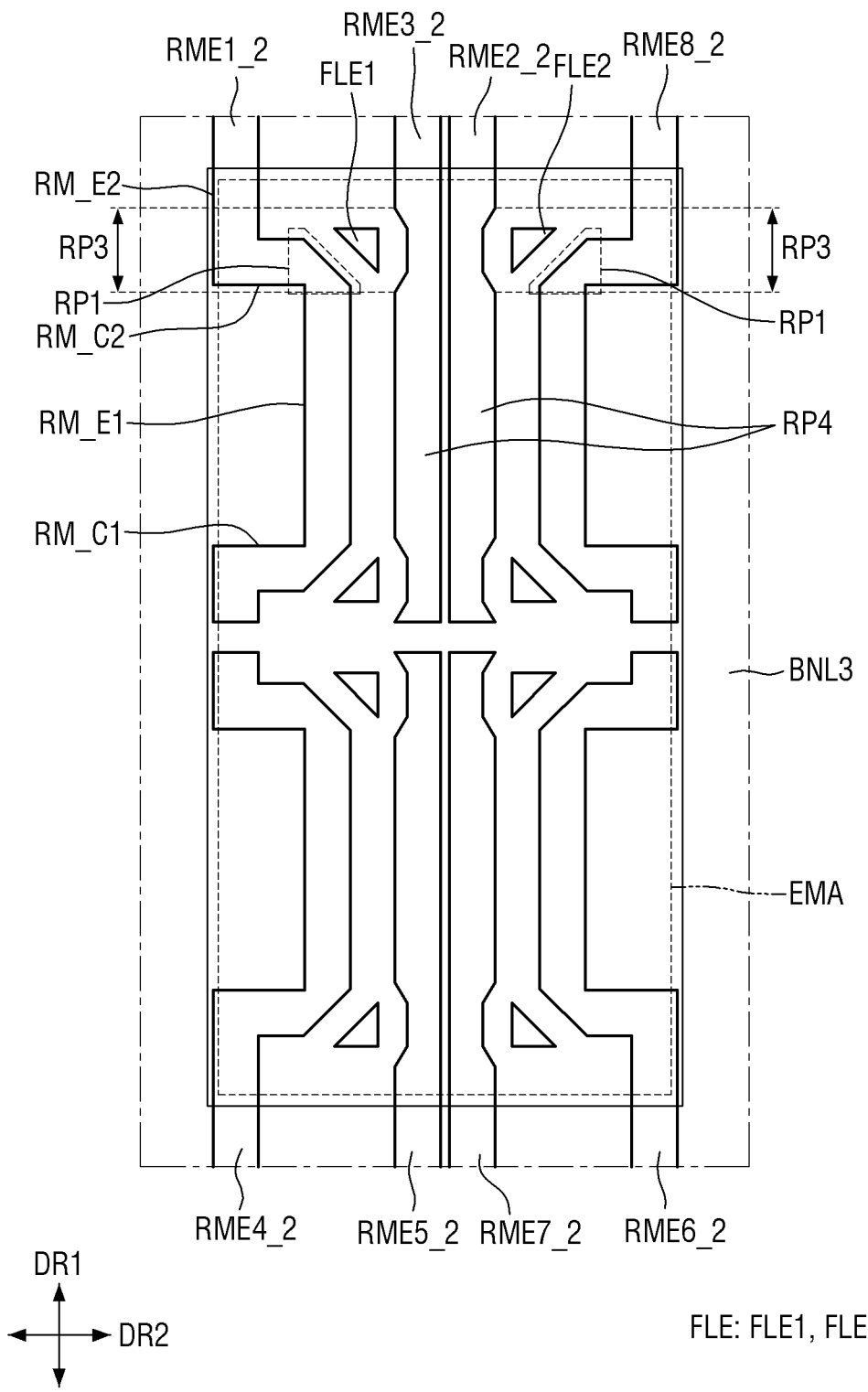
FIG. 20 is a schematic plan view schematically showing electrodes of a display device according to an embodiment.
Figure 21:
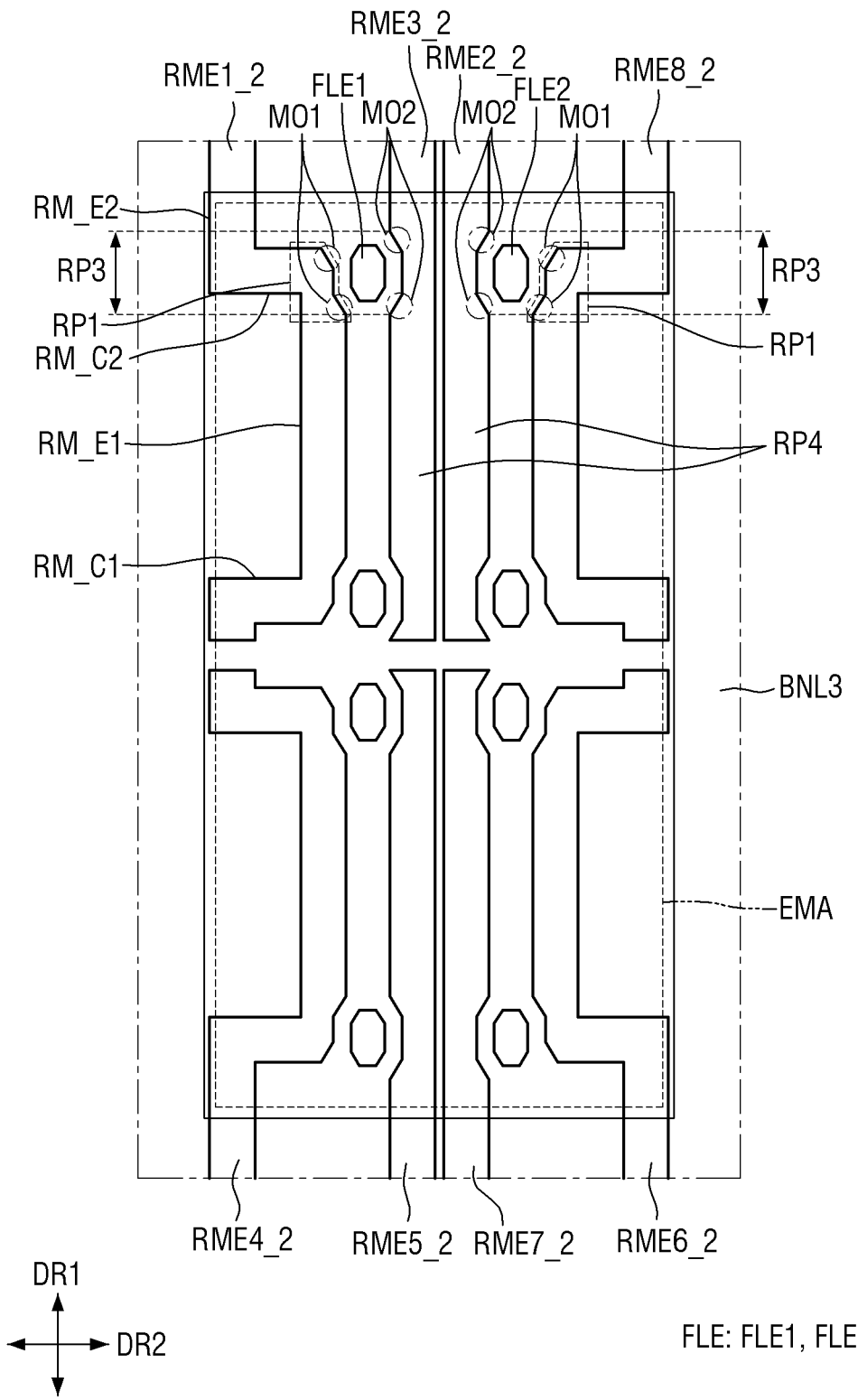
FIG. 21 is a schematic plan view schematically showing electrodes of a display device according to an embodiment.
Figure 22:
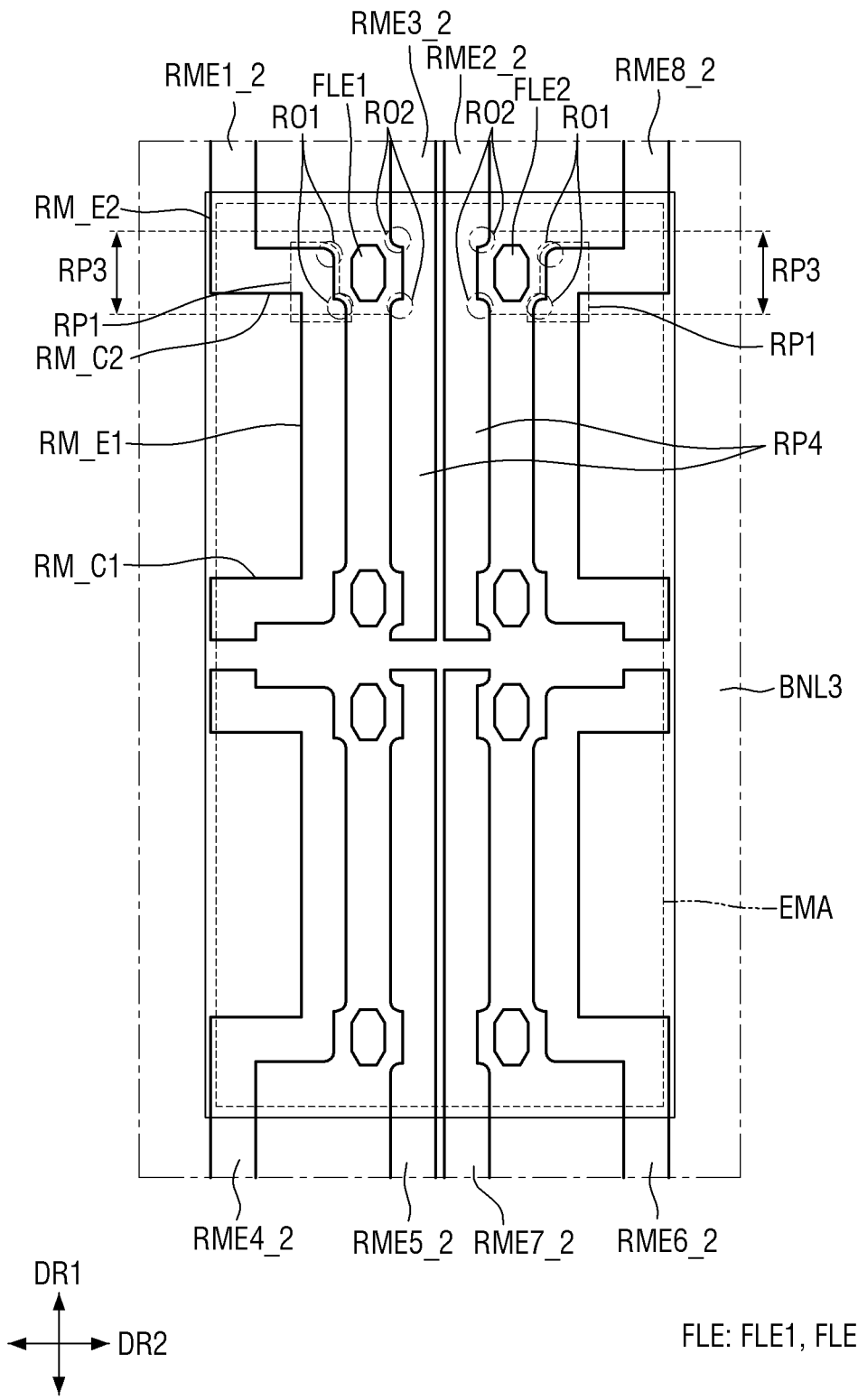
FIG. 22 is a schematic plan view schematically showing electrodes of a display device according to an embodiment.

FIG. 20 is a schematic plan view schematically showing electrodes of a display device according to an embodiment. FIG. 21 is a schematic plan view schematically showing electrodes of a display device according to an embodiment. FIG. 22 is a schematic plan view schematically showing electrodes of a display device according to an embodiment. Embodiments of FIGS. 20 to 22 may be different from the embodiments of FIGS. 13 to 19 in that the electrodes have different shapes. The embodiments of FIGS. 20 to 22 may be substantially identical to an embodiment of FIG. 13 except for the shapes of the electrodes; and, therefore, the redundant descriptions will be omitted.

Referring to FIG. 20 in conjunction with FIG. 13, according to this embodiment, electrodes RME may include electrodes RME having a symmetrical structure to guide the light-emitting diodes ED so that they are concentrated at a particular location.

According to an embodiment, the electrodes RME, for example, the first to eighth electrodes RME1_2 to RME8_2 may be the first-type electrodes RME #1. For example, each of the first electrode RME1_2, the fourth electrode RME4_2, the sixth electrode RME6_2 and the eighth electrode RME8_2 may include a first portion RP1 having a narrow width between the extended electrode portion RM_E1 and the bent electrode portions RM_C1 and RM_C2. Each of the second electrode RME2_2, the third electrode RME3_2, the fifth electrode RME5_2 and the seventh electrode RME7_2 may include a third portion RP3 having a narrow width and a fourth portion RP4 having a width larger than the width of the third portion RP3. The first electrode RME1_2 and the fourth electrode RME4_2 may be symmetrical to each other in the first direction DR1, and the eighth electrode RME8_2 and the sixth electrode RME6_2 may be symmetrical to each other in the first direction DR1. The third electrode RME3_2 and the fifth electrode RME5_2 may be symmetrical to each other in the first direction DR1, and the second electrode RME2_2 and the seventh electrode RME7_2 may be symmetrical to each other in the first direction DR1.

The bent electrode portions RM_C1 and RM_C2, the first portions RP1 and the extended electrode portions RM_E1 and RM_E2 may be repeated, such that the width of each of first electrode RME1_2, the fourth electrode RME4_2, the sixth electrode RME6_2 and the eighth electrode RME8_2 may vary along the first direction DR1. The third portions RP3 and the fourth portions RP4 may be repeated, such that the width of each of second electrode RME2_2, the third electrode RME3_2, the fifth electrode RME5_2 and the seventh electrode RME7_2 may vary along the first direction DR1.

The shape of the first-type electrodes RME #1 will be described with reference to the first electrode RME1_2 and the third electrode RME3_2 as an example. The first electrode RME1_2 may include one or more first portions RP1 disposed in the emission area EMA. The first portions RP1 may be spaced apart from one another in the first direction DR1 and the extended electrode portion RM_E1 may be disposed therebetween. In the example shown in FIG. 17, two first portions RP1 are disposed in the emission area EMA, and the extended electrode portion RM_E1 is disposed between them. The third electrode RME3_2 may include one or more third portions RP3 disposed in the emission area EMA, and the third portions RP3 are spaced apart from one another in the first direction DR1, and the fourth portion RP4 may be disposed therebetween. In the example shown in FIG. 20, two third portions RP3 are disposed in the emission area EMA, and the fourth portion RP4 is disposed between them.

According to the embodiment, the inner side of the first electrode RME1_2 facing the third electrode RME3_2 and the inner side of the third electrode RME3_2 facing the first electrode RME1_2 may protrude or may be recessed in a certain direction, and thus the widths of the first electrode RME1_2 and the third electrode RME3_2 may vary. In other words, the width of each of the first electrode RME1_2 and the third electrode RME3_2 may vary depending on positions.

The width of the first portions RP1 of the first electrode RME1_2 and the third portions RP3 of the third electrode RME3_2 may be the minimum width of the first electrode RME1_2 and the third electrode RME3_2, while the width of the extended electrode portion RM_E1 of the first electrode RME1_2 and the fourth portions RP4 of the third electrode RME3_2 may be the maximum width. The first electrode RME1_2 and the third electrode RME3_2 may have the same width except for the first portions RP1 and the third portions RP3. The width may become smaller at the portions where the first portions RP1 face the third portions RP3, respectively.

According to the embodiment, the inner side of the first portions RP1 of the first electrode RME1_2 facing the third portions RP3 of the third electrode RME3_2 may have an inclined shape, and may have a recessed shape substantially like a triangle when viewed from the top. The inner side of the third portions RP3 of the third electrode RME3_2 facing the first electrode RME1_2 may have an inclined shape, and may have a recessed shape substantially like a quadrangle when viewed from the top. The first portions RP1 may have the minimum width at the center of the inclined inner side of the first portions RP1 of the first electrode RME1_2. The third portions RP3 may have the minimum width in the area where the inclined inner sides of the third portions RP3 of the third electrode RME3_2 meet each other. The width of the first electrode RME1_2 may decrease at the first portion RP1 and may increase at the extended electrode portions RM_E1 and RM_E2 and the bent electrode portions RM_C1 and RM_C2. The width of the third electrode RME3_2 may decrease gradually at the third portion RP3 and increase from the position where the inclined inner sides meet. It is, however, to be understood that the disclosure is not limited thereto.

The second electrode RME2_2 may be symmetrical to the third electrode RME3_2, and the eighth electrode RME8_2 may be symmetrical to the first electrode RME1_2. Accordingly, the second electrode RME2_2 may include the third portion RP3 and the fourth portion RP4, and the eighth electrode RME8_2 may include the first portion RP1. Likewise, the fourth electrode RME4_2 and the sixth electrode RME6_2 may also include the first portion RP1, and the fifth electrode RME5_2 and the seventh electrode RME7_2 may also include the third portion RP3 and the fourth portion RP4.

The first electrode RME1_2 and the third electrode RME3_2 will be described as an example. According to the embodiment, the distance between the inner side of the first portions RP1 of the first electrode RME1_2 and the inner side of the third portions RP3 of the third electrode RME3_2 may gradually increase along the first direction DR1. On the contrary, the distance between the inner side of the extended electrode portion RM_E1 of the first electrode RME1_2 and the inner side of the fourth portion RP4 of the third electrode RME3_2 is constant. Accordingly, in case that an electric field is generated between the first electrode RME1_2 and the third electrode RME3_2, the electric field is constant between the inner side of the extended electrode portion RM_E1 of the first electrode RME1_2 and the inner side of the fourth portion RP4 of the third electrode RME3_2, whereas the electric field becomes gradually weaker as the distance between the inner side of the first portion RP1 of the first electrode RME1_2 and inner side of the third portion RP3 of the third electrode RME3_2 increases.

In case that the ink containing the light-emitting diodes ED is disposed on the electrodes RME, the light-emitting diodes ED gather to a position where the electric field is stronger. For example, since the intensity of the electric field is greatest between the extended electrode portion RM_E1 of the first electrode RME1_2 and the fourth portion RP4 of the third electrode RME3_2, the light-emitting diodes ED may gather at the middle of the emission area EMA. The density of the light-emitting diodes ED is relatively low between the first portions RP1 of the first electrode RME1_2 and the third portions RP3 of the third electrode RME3_2 where the intensity of the electric field is relatively weak. In this manner, it is possible to prevent the light-emitting diodes ED from gathering at the edges of the emission area EMA, and to align them at the middle of the emission area EMA.

According to this embodiment, unlike embodiments of FIGS. 13 to 19 in which the first electrode RME1_2, the fourth electrode RME4_2, the sixth electrode RME6_2 and the eighth electrode RME8_2 have the first portions RP1 having a narrow width, the third electrode RME3_2 facing the first electrode RME1_2, the fifth electrode RME5_2 facing the fourth electrode RME4_2, the seventh electrode RME7_2 facing the sixth electrode RME6_2 and the second electrode RME2_2 facing the eighth electrode RME8_2 may also have the third portions RP3 having a narrow width. Accordingly, it is possible to further reduce the intensity of the electric field generated at the edges of the emission area EMA, thereby preventing the light-emitting diode ED from gathering at the edges of the emission area EMA and aligning the light-emitting diode ED at the middle of the emission area EMA.

According to an embodiment, the first electrode RME1_2, the fourth electrode RME4_2, the sixth electrode RME6_2 and the eighth electrode RME8_2 may include floating electrodes FLE adjacent to the first portions RP1. A first floating electrode FLE1 may be disposed between the first portion RP1 of the first electrode RME1_2 and the third portion RP3 of the third electrode RME3_2, and a first floating electrode FLE1 may be disposed between the first portion RP1 of the fourth electrode RME4_2 and the third portion RP3 of the fifth electrodes RME5_2. A second floating electrode FLE2 may be disposed between the first portion RP1 of the eighth electrode RME8_2 and the third portion RP3 of the second electrode RME2_2, and a second floating electrode FLE2 may be disposed between the first portion RP1 of the sixth electrode RME6_2 and the third portion RP3 of the seventh electrodes RME7_2.

The floating electrodes FLE may be formed in shapes generally conforming to the shape of recesses inner sides of the first portion RP1 and the shape of recessed inner sides of the third portion RP3 when viewed from the top. For example, as shown in FIG. 20, in case that the shape of the recessed inner side of the first portions RP1 of the first electrode RME1_2 is a triangle, and the shape of the recessed inner side of the third portions RP3 of the third electrode RME3_2 is a quadrangle when viewed from the top, the shape of the floating electrodes FLE may be formed in a substantially triangular shape when viewed from the top. It is, however, to be understood that the disclosure is not limited thereto.

Referring to an embodiment of FIG. 21, each of an inner side of a first portion RP1 of a first electrode RME1_2 and an inner side of a third portion RP3 of a third electrode RME3_2 may include chamfered corners MO. For example, the inner side of the first portion RP1 may include first chamfered corners MO1, and the inner side of the third portion RP3 may include second chamfered corners MO2. Likewise, an inner side of a third portion RP3 of a second electrode RME2_2 may include second chamfered corners MO2, and an inner side of a first portion RP1 of an eighth electrode RME8_2 may include first chamfered corners MO1. The inner side of the first portion RP1 of each of the fourth electrode RME4_2 symmetrical to the first electrode RME1_2 in the first direction DR1 and the sixth electrode RME6_2 symmetrical to the eighth electrode RME8_2 in the first direction DR1 may include first chamfered corners MO1. Likewise, the inner side of the third portion RP3 of each of the fifth electrode RME5_2 symmetrical to the third electrode RME3_2 in the first direction DR1 and the seventh electrode RME7_2 symmetrical to the second electrode RME2_2 in the first direction DR1 may include second chamfered corners MO2.

The chamfered corners MO of the inner side of the first portions RP1 or the third portions RP3 of each of the first to eighth electrodes RME1_2 to RME8_2 can prevent that the electric field is concentrated which may occur in case that the inner side has corners at the right angle. Accordingly, it is possible to prevent the intensity of the electric field between the first portion RP1 of the first electrode RME1_2 and the third portion RP3 of the third electrode RME3_2, between the first portion RP1 of the fourth electrode RME4_2 and the third portion RP3 of the fifth electrode RME5_2, between the first portion RP1 of the sixth electrode RME6_2 and the third portion RP3 of the seventh electrode RME7_2, and between the first portion RP1 of the eighth electrode 8_2 and the third portion RP3 of the second electrode RME2_2.

According to an embodiment, floating electrodes FLE may be included between the first portion RP1 of the first electrode RME1_2 and the third portion RP3 of the third electrode RME3_2, between the first portion RP1 of the fourth electrode RME4_2 and the third portion RP3 of the fifth electrode RME5_2, between the first portion RP1 of the sixth electrode RME6_2 and the third portion RP3 of the seventh electrode RME7_2, and between the first portion RP1 of the eighth electrode RME8_2 and the third portion RP3 of the second electrode RME2_2, respectively.

For example, the floating electrodes FLE may be formed in shapes conforming to the shape of the recessed inner side of the first portion RP1 of the first electrode RME1_2 and the shape of the recessed inner side of the third portion RP3 of the third electrode RME3_2 when viewed from the top. For example, the floating electrodes FLE may be formed in an octagonal shape as shown in FIG. 21. It is, however, to be understood that the disclosure is not limited thereto. At least one side or a side of each of the floating electrodes FLE may include inclined surfaces parallel to the first chamfered corners MO1 of the first portion RP1 and to the second chamfered corners MO2 of the third portions RP3, so that the distance between the electrodes and the floating electrodes FLE can be maintained.

Referring to an embodiment of FIG. 22, each of an inner side of a first portion RP1 of a first electrode RME1_2 and an inner side of a third portion RP3 of a third electrode RME3_2 may include rounded corners RO. For example, the inner side of the first portion RP1 may include first rounded corners RO1, and the inner side of the third portion RP3 may include second rounded corners RO2. Likewise, an inner side of a third portion RP3 of a second electrode RME2_2 may include second rounded corners RO2, and an inner side of a first portion RP1 of an eighth electrode RME8_2 may include first rounded corners RO1. The inner side of the first portion RP1 of each of the fourth electrode RME4_2 symmetrical to the first electrode RME1_2 in the first direction DR1 and the sixth electrode RME6_2 symmetrical to the eighth electrode RME8_2 in the first direction DR1 may include first rounded corners RO1. Likewise, the inner side of the third portion RP3 of each of the fifth electrode RME5_2 symmetrical to the third electrode RME3_2 in the first direction DR1 and the seventh electrode RME7_2 symmetrical to the second electrode RME2_2 in the first direction DR1 may include second rounded corners RO2.

The rounded corners RO of the inner side of the first portions RP1 or the third portions RP3 of each of the first to eighth electrodes RME1_2 to RME8_2 can prevent that the electric field is concentrated which may occur in case that the inner side has corners at the right angle. Accordingly, it is possible to prevent the intensity of the electric field between the first portion RP1 of the first electrode RME1_2 and the third portion RP3 of the third electrode RME3_2, between the first portion RP1 of the fourth electrode RME4_2 and the third portion RP3 of the fifth electrode RME5_2, between the first portion RP1 of the sixth electrode RME6_2 and the third portion RP3 of the seventh electrode RME7_2, and between the first portion RP1 of the eighth electrode RME8_2 and the third portion RP3 of the second electrode RME2_2.

According to an embodiment, floating electrodes FLE may be included between the first portion RP1 of the first electrode RME1_2 and the third portion RP3 of the third electrode RME3_2, between the first portion RP1 of the fourth electrode RME4_2 and the third portion RP3 of the fifth electrode RME5_2, between the first portion RP1 of the sixth electrode RME6_2 and the third portion RP3 of the seventh electrode RME7_2, and between the first portion RP1 of the eighth electrode RME8_2 and the third portion RP3 of the second electrode RME2_2, respectively. The floating electrodes FLE have been described above with reference to FIG. 21; and, therefore, the redundant descriptions will be omitted.

As described above, in the display device according to the embodiments, at least some or a number of the electrodes have portions having a narrow width, thereby preventing that the light-emitting diodes gather at a particular location of the emission area.

According to an embodiment, portions having a narrow width are formed at at least some or a number of the electrodes at the edges of the emission area, so that the distances between the electrodes are increased. By doing so, the intensity of the electric field is reduced to prevent the light-emitting diodes from gathering at the edges of the emission area and to guide them to the middle of the emission area.

According to an embodiment, portions having a narrow width are formed at least some or a number of the electrodes, and floating electrodes are formed between the electrodes generating an electric field, so that the intensity of the electric field can be reduced.

According to an embodiment, a corner of the electrodes where the electric field is concentrated is inclined, chamfered or rounded, so that the intensity of the electric field can be reduced to prevent the light-emitting diodes from gathering at the corner and to guide them to the middle of the emission area.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   electrodes disposed on a substrate, extended in a first direction, and spaced apart from one another in a second direction intersecting the first direction; and
   light-emitting elements having ends disposed on the electrodes, wherein
   the electrodes comprise:
      a first electrode having a first portion and a second portion; and
      a floating electrode adjacent to the first portion of the first electrode, and
   a width of the second portion is greater than a width of the first portion in the second direction.

2. The display device of claim 1, wherein
   the electrodes comprise:
      a second electrode spaced apart from the first electrode in the second direction;
      a third electrode disposed between the first electrode and the second electrode; and
      a fourth electrode spaced apart from the second electrode in the second direction, and
   the floating electrode is disposed between the first portion of the first electrode and the third electrode.

3. The display device of claim 2, wherein
   the first electrode comprises an inner side facing the third electrode, and
   a distance between the inner side of the first portion of the first electrode and the third electrode is greater than a distance between the inner side of the second portion of the first electrode and the third electrode.

4. The display device of claim 3, wherein
   the distance between the inner side of the first portion of the first electrode and the third electrode is measured in the second direction, and
   the floating electrode is disposed between the first electrode and the third electrode.

5. The display device of claim 4, wherein an outer side of the first portion of the first electrode is parallel to at least a side of the third electrode facing the first electrode in the first direction.

6. The display device of claim 5, wherein the inner side of the first portion of the first electrode is recessed in the second direction from the inner side of the second portion.

7. The display device of claim 2, wherein
   the third electrode comprises a first portion and a second portion, and
   the floating electrode is disposed between the first portion of the first electrode and the first portion of the third electrode.

8. The display device of claim 2, wherein
   each of the first electrode and the third electrode comprises first portions spaced apart from each other in the first direction, and
   the second portion is disposed between the first portions.

9. The display device of claim 7, wherein the first portion of the third electrode comprises at least one chamfered or rounded corner in at least one bent edge of the first portion of the third electrode.

10. The display device of claim 1, wherein the first portion of the first electrode comprises at least one chamfered or rounded corner in at least one bent edge of the first portion of the first electrode.

11. The display device of claim 2, wherein ends of the light-emitting elements are disposed on the first electrode and the third electrode, and disposed on the second electrode and the fourth electrode.

12. The display device of claim 2, further comprising:
contact electrodes disposed on the electrodes and in contact with at least part of the light-emitting elements.

13. A display device comprising:
a first electrode and a second electrode disposed on a substrate and extended in a first direction;
a third electrode disposed between the first electrode and the second electrode; and
a fourth electrode spaced apart from the second electrode in a second direction intersecting the first direction; and
light-emitting elements having ends disposed on the first electrode and the third electrode, and on the second electrode and the fourth electrode, wherein
the first electrode comprises:
a first portion that is bent and adjacent to the third electrode; and
a floating electrode adjacent to the first portion of the first electrode, and
the floating electrode is disposed between the first portion of the first electrode and the third electrode.

14. The display device of claim 13, wherein the first electrode comprises:
an extended electrode portion extended in the first direction; and
a bent electrode portion bent from a side of the extended electrode portion in the first direction and extended in the second direction.

15. The display device of claim 14, wherein the first portion of the first electrode is disposed at an area where the extended electrode portion meets the bent electrode portion.

16. The display device of claim 14, wherein
the third electrode comprises an inner side facing the first electrode,
the inner side of the third electrode is parallel to the first direction, and
the floating electrode is disposed between the first portion of the first electrode and the inner side of the third electrode.

17. The display device of claim 14, wherein
the third electrode comprises a third portion and a fourth portion having a greater width than a width of the third portion in the second direction, and
the floating electrode is disposed between the first portion of the first electrode and the third portion of the third electrode.

18. The display device of claim 17, wherein the third portion of the third electrode comprises at least one chamfered or rounded corner in at least one bent edge of the third portion of the third electrode.

19. A display device comprising:
first-type electrodes disposed on a substrate, extended in a first direction, and spaced apart from one another in a second direction intersecting the first direction;
second-type electrodes spaced apart from the first-type electrodes in the second direction between the first-type electrodes; and
light-emitting elements disposed on the first-type electrodes and the second-type electrodes, wherein
each of the first-type electrodes comprises:
a first portion;
a second portion having a width greater than a width of the first portion in the second direction; and
a floating electrode adjacent to the first portion, and
a distance between the first portion of the first-type electrodes and the second-type electrodes facing the first portion is greater than a distance between the second portion of the first-type electrodes and the second-type electrode facing the second portion.

20. The display device of claim 19, wherein the floating electrode is disposed between the first portion of the first-type electrodes and the second-type electrodes.

21. The display device of claim 19, wherein
the second-type electrodes comprise a first portion and a second portion,
the first portion of the first-type electrodes and the first portion of the second-type electrodes face each other, and
the second portion of the first-type electrodes and the second portion of the second-type electrode face each other.

22. The display device of claim 21, wherein the floating electrode is disposed between the first portion of the first-type electrodes and the first portion of the second-type electrodes.

23. The display device of claim 1, wherein the floating electrode extends only a portion of the length of the electrodes in the first direction.

24. The display device of claim 1, wherein the floating electrode extends only about a same length as the first portion.

25. The display device of claim 1, wherein at least one of the light-emitting elements directly contacts the first electrode at the second portion.

* * * * *